(12) United States Patent
Xu et al.

(10) Patent No.: US 12,106,924 B2
(45) Date of Patent: Oct. 1, 2024

(54) INVERTED CYLINDRICAL MAGNETRON (ICM) SYSTEM AND METHODS OF USE

(71) Applicant: VACTRONIX SCIENTIFIC LLC, Fremont, CA (US)

(72) Inventors: Tianzong Xu, San Ramon, CA (US); George Xinsheng Guo, Palo Alto, CA (US); Oahn Nguyen, Union City, CA (US)

(73) Assignee: Vactronix Scientific, LLC, San Antonio, TX (US)

( * ) Notice: Subject to any disclaimer, the term of this patent is extended or adjusted under 35 U.S.C. 154(b) by 591 days.

(21) Appl. No.: 17/317,723

(22) Filed: May 11, 2021

(65) Prior Publication Data

US 2021/0375573 A1 Dec. 2, 2021

Related U.S. Application Data

(60) Continuation of application No. 15/583,916, filed on May 1, 2017, now Pat. No. 11,004,644, which is a
(Continued)

(51) Int. Cl.
*C23C 14/35* (2006.01)
*C23C 14/56* (2006.01)
(Continued)

(52) U.S. Cl.
CPC .............. *H01J 23/02* (2013.01); *C23C 14/35* (2013.01); *C23C 14/566* (2013.01);
(Continued)

(58) Field of Classification Search
CPC ....................................................... C23C 14/35
(Continued)

(56) References Cited

U.S. PATENT DOCUMENTS 4,572,842 A * 2/1986 Dietrich .............. H01J 37/3405
427/571
4,774,437 A * 9/1988 Helmer .................. H01J 37/08
315/111.41

(Continued)

FOREIGN PATENT DOCUMENTS

JP 58037177 A * 3/1983 ......... C23C 14/3407

*Primary Examiner* — John J Brayton
(74) *Attorney, Agent, or Firm* — Rosenbaum IP, P.C.; David G. Rosenbaum

(57) ABSTRACT

An Inverted Cylindrical Magnetron (ICM) System and Methods of Use is disclosed herein generally comprising a co-axial central anode concentrically located within a first annular end anode and a second annular end anode; a process chamber including a top end and a bottom end in which the first annular end anode and the second annular end anode are coaxially disposed, whereby the first annular end anode, the second annular end anode, and the central anode form a 3-anode configuration to provide electric field uniformity, and the process chamber including a central annular space coupled to a tube insulator disposed about the central annular space wall; a cathode concentrically coupled to the tube insulator and a target; and a plurality of multi-zone electromagnets or hybrid electro-permanent magnets surrounding the exterior of the process chamber providing a tunable magnetic field.

13 Claims, 21 Drawing Sheets

Related U.S. Application Data division of application No. 13/788,081, filed on Mar. 7, 2013, now Pat. No. 9,640,359.

(60) Provisional application No. 61/681,403, filed on Aug. 9, 2012.

(51) Int. Cl.
*H01J 23/02* (2006.01)
*H01J 37/34* (2006.01)

(52) U.S. Cl.
CPC ...... *H01J 37/3405* (2013.01); *H01J 37/3417* (2013.01); *H01J 37/342* (2013.01)

(58) Field of Classification Search
USPC .................................................. 204/298.21
See application file for complete search history.

(56) References Cited

U.S. PATENT DOCUMENTS

| | | | | |
|---|---|---|---|---|
| 4,966,677 | A | * | 10/1990 | Aichert ............... C23C 14/3407 204/298.24 |
| 5,178,743 | A | * | 1/1993 | Kumar ................... C23C 14/56 204/192.12 |
| 5,228,963 | A | * | 7/1993 | Rose .................. H01J 37/3455 204/192.12 |
| 7,901,552 | B2 | * | 3/2011 | Pavloff ............... C23C 14/3407 204/298.12 |

* cited by examiner

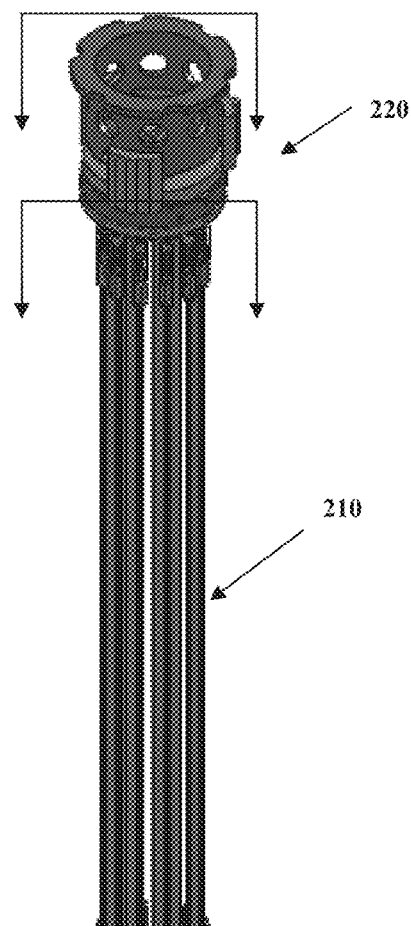
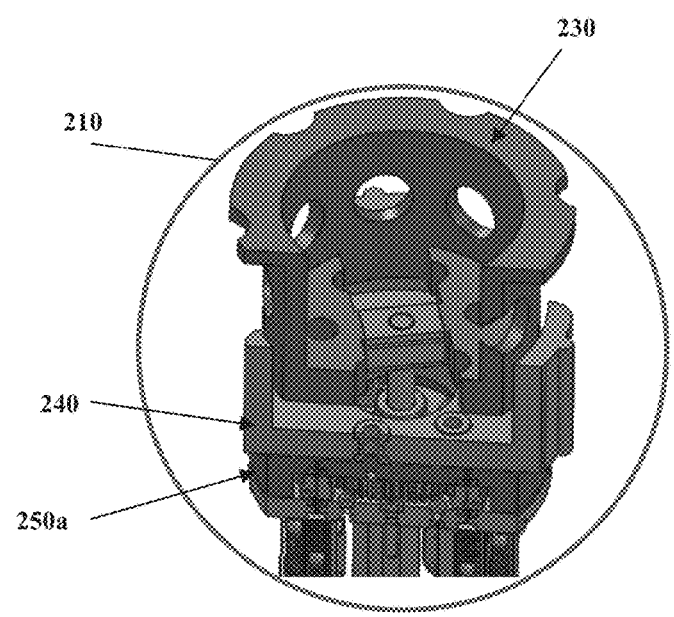
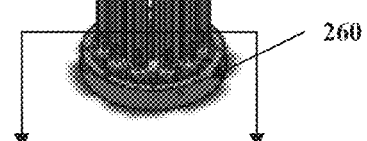
Fig. 8a
Fig. 8b
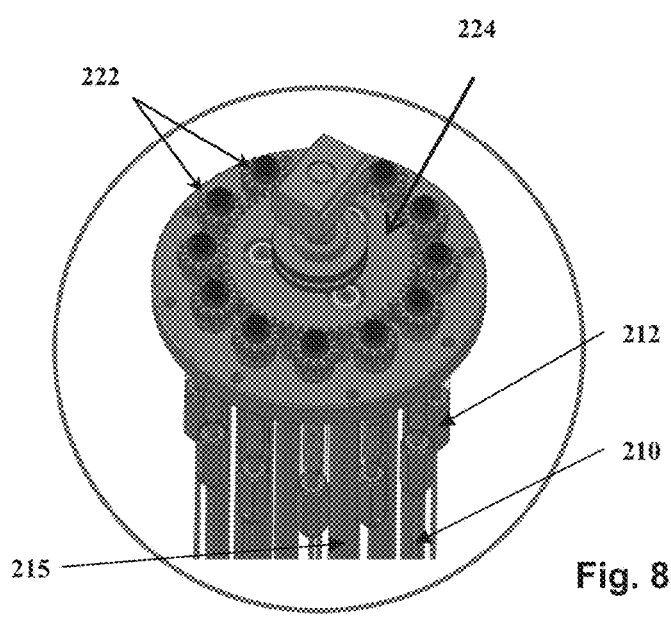
Fig. 8c

INVERTED CYLINDRICAL MAGNETRON (ICM) SYSTEM AND METHODS OF USE

CROSS-REFERENCE TO RELATED APPLICATIONS

The present application is a continuation of U.S. patent application Ser. No. 15/583,916 filed May 1, 2017, issued as U.S. Pat. No. 11,004,644 on May 11, 2021, which is a divisional of and claims priority to U.S. patent application Ser. No. 13/788,081, filed Mar. 7, 2013, issued as U.S. Pat. No. 9,640,359 on May 2, 2017, which claims priority to U.S. Provisional Patent Application Ser. No. 61/681,403, filed Aug. 9, 2012, each of which are hereby incorporated by reference in their entirety.

BACKGROUND

The invention generally relates to inverted cylindrical magnetron sources and the methods of use.

The use of magnetron sputtering in the rapid deposition of metal films, reactively sputtered compound films and etching processes has found broad acceptance. The most-used type is the planar magnetron and its deposition profile and shown that the uniformity of the film thickness depends on the plasma sheath thickness and the magnetic field strength. The so-called inverted cylindrical magnetron (ICM), in which the target is a cylinder eroded by the sputtering plasma at the inner surface, is more complicated in target geometry and bonding, and hence its greater fabrication cost.

In addition, conventional ICM sources are developed mainly for single substrate deposition and have only annular end-anodes as the actual anodes. Imaginary central virtual anode (plasma with potential equal to the end-anode potential) provide electron-conducting path along axial direction without blocking deposition flux. However, such virtual anode forming along magnetic field lines is still inferior as the magnetic field lines are curved to cathode side towards two ends, and also the virtual anode is subject to operation conditions and actual hardware design. Under some ICM operation conditions, plasma impedance can be quite high such that the electrical field uniformity is not as good as that with actual anode (made of metal: very low resistance).

With conventional art, the chamber wall is electrically connected to the target as the cathode and thus electrical insulator at each end is required. Those electrical insulators are normally made of brazed ceramics-metal tubular structure, which will add alignment error and can still be subject to electrical short due to metallic deposits.

Conventional art ICM sources using metallic bonded target to copper tube is very expensive and has significant operation temperature limit due to lower melting point of bonding materials, which makes it almost impossible for high deposition rate applications. For some applications that require specific target temperature control, copper construction may lead to temperature non-uniformity due to copper's very high heat conductivity and relatively lower heat capacitance.

The prior art of ICM magnetron uses permanent magnets and has only fixed magnetic field and inherently suffers from non-uniform target erosion and related film deposition non-uniformity. Implementation of some motion mechanisms can help improve the uniformity to certain extent, but it creates hardware complexity and is still lacking easy magnetic field tunability, which cannot meet stringent requirements of high demanding applications such as ultra-precise stoichiometry control in medical device material deposition that exceeds known PVD film applications at over 1 um thickness range.

In the conventional configuration, the endcap is made of metallic component such as a cathode end flange to electrically reflect high energy electron back into plasma so that "end losses to anode" can be significantly reduced. Although the main cathode/target is sputtered, the cathode end flange should be of the same material or coated with the same target materials when contamination is not tolerable and very high purity coating is required.

Conventional coil design applies a single zone solenoid coil and suffers non-uniform magnetic flux density along the axial direction. Multiple solenoid coils in series suffer from non-smooth magnetic field transition profiles. And conventional ICM magnetron sputtering has fixed substrate-to-target distance per equipment design and it is normally not an available process-tuning knob.

The present invention attempts to solve these problems as well as others in order to meet stringent requirements of high demanding applications.

SUMMARY OF THE INVENTION

Provided herein are systems and methods for an Inverted Cylindrical Magnetron, generally comprising a co-axial central anode concentrically located within a first annular end anode and a second annular end anode; a process chamber including a top end and a bottom end in which the first annular end anode and the second annular end anode are coaxially disposed, whereby the first annular end anode, the second annular end anode, and the central anode form a 3-anode configuration to provide electric field uniformity, and the process chamber including a central annular space coupled to a tube insulator disposed about the central annular space wall; a cathode concentrically coupled to the tube insulator and a target; and a plurality of multi-zone electromagnets or hybrid electro-permanent magnets surrounding the exterior of the process chamber providing a tunable magnetic field.

The systems and methods are set forth in part in the description which follows, and in part will be obvious from the description, or can be learned by practice of the methods, apparatuses, and systems. The advantages of the systems and methods will be realized and attained by means of the elements and combinations particularly pointed out in the appended claims. It is to be understood that both the foregoing general description and the following detailed description are exemplary and explanatory only and are not restrictive of the systems and methods, as claimed.

BRIEF DESCRIPTION OF THE DRAWINGS

In the accompanying figures, like elements are identified by like reference numerals among the several preferred embodiments of the present invention.

FIG. 8a-8c are perspective views of the planetary rotation carousal holder design.

DETAILED DESCRIPTION OF THE INVENTION

The foregoing and other features and advantages of the invention are apparent from the following detailed description of exemplary embodiments, read in conjunction with the accompanying drawings. The detailed description and drawings are merely illustrative of the invention rather than limiting, the scope of the invention being defined by the appended claims and equivalents thereof.

Generally speaking, the inverted cylindrical magnetron source (ICM), also known as hollow cathode magnetron source, and associated sputter deposition system are deployed for high throughput and precisely controlled uniform deposition of high purity cylindrical metallic thin films.

Figure 1A:
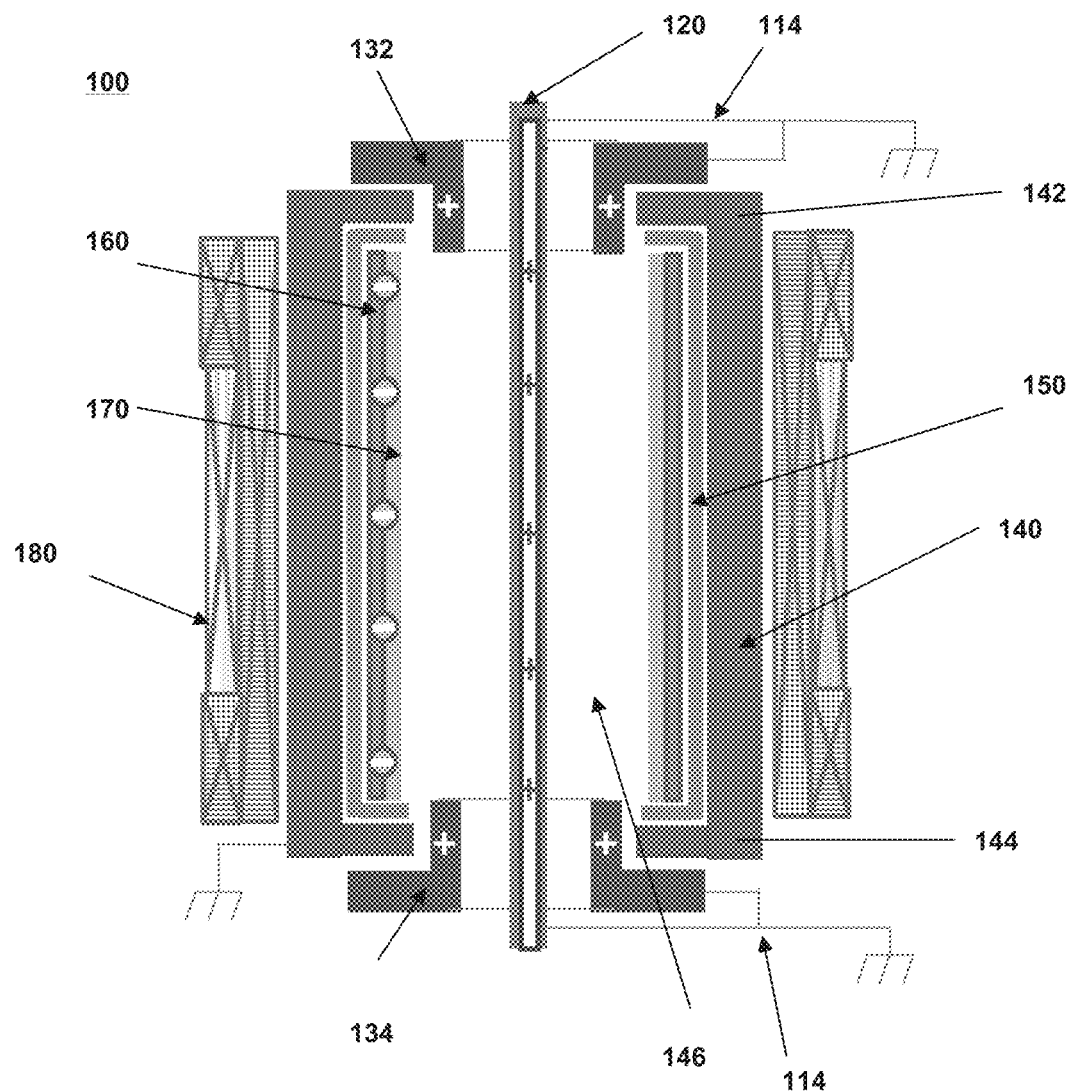
FIG. 1a is a schematic cross-section of the multi-zone magnets for tunable magnetic field and addition of central anode for more uniform electrical field.

As shown in FIG. 1a, an inverted cylindrical magnetron (ICM) source 100 generally comprises a co-axial central anode 120 concentrically located within a first annular end anode 132 and a second annular end anode 134, which is the core of a cylindrical process chamber 320 including a top end 142 and a bottom end 144 in which the first annular end anode 132 and the second annular end anode 134 are coaxially disposed, respectively. The first annular end anode 132, the second annular end anode 134, and the central anode 120 form a 3-anode configuration provides improved electric field uniformity. The process chamber 320 includes a central annular space 146 coupled to a tube insulator 150 disposed about the central annular space wall. A cathode 160 is concentrically coupled to the tube insulator 150 and a target 170. Surrounding the exterior process chamber 320 are multi-zone magnets 180 for a tunable magnetic field.

The co-axial central anode 120 in addition to annular end anodes 132, 134 for improved electrical field uniformity, temperature adjustable target cooling jacket 162 (FIG. 4), multi-zone tunable electromagnet coil arrays 180, a plurality of working gas flow inlets 414 & pumping routines (FIG. 5) for high deposition uniformity & target utilization and precise deposition stoichiometry control. The pressure and flow may have alternative top flow and bottom flow rates. In one embodiment, the pressure may be between 0.1 to 0.9 mTorr from the top flow and the pressure may be between −0 and 10.0 mT for the bottom flow.

The central anode 120 provides more solid and uniform electron-conducting path along the axial direction. Even with the central anode only (by electrically floating the two end-anodes 132, 134), plasma ignition is easier, deposition uniformity is better and operation regime is widened to even lower pressure and/or lower discharge current range without sacrifice of deposition rate. This is contrary to the common thought that enlarged gap size between cathode and anode will cause increased voltage drop from plasma to anode such that sputtering efficacy is reduced. In one embodiment, the optimized gap size is between about 0.5-20.5 mm. In other embodiments, the gap size between the end anode and the target (cathode) is set between about 1.5-2.0 mm. In other embodiments, the gap size between the central anode and the cathode is between about 8.0-9.0 mm, which may have better plasma stability.

Figure 1B:
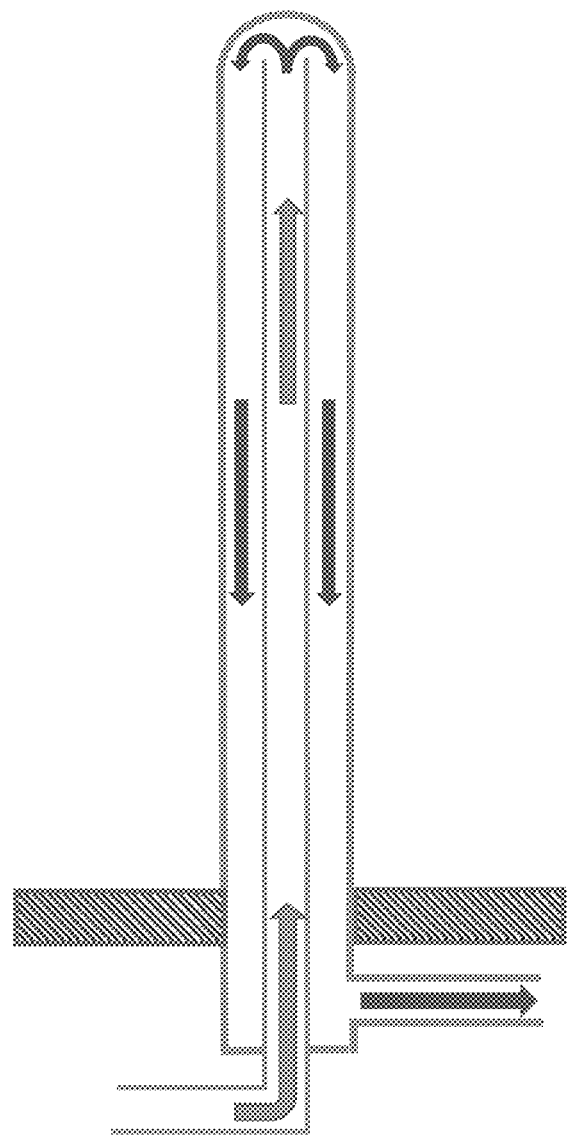
FIG. 1b is schematic cross-section of the central anode that can also serve as an indirect cooling conduit for tubular substrates and the process chamber.

When blockage of deposition flux is no longer a real concern, such as in the case of multiple-substrate deposition (circular array of substrate surrounding the central anode), the actual central anode 120 provides much more benefits, including, but not limited to: (1) very uniform electrical field with negligible voltage drop along the axis; (2) can be an indirect cooling conduit for tubular substrates and/or process chamber (FIG. 1b); (3) can be a conduit to embed a plurality of working gas inlets 414 along the central axial length of the central anode 120 for uniform gas supply into the process chamber; or (4) the central anode can be a conduit to host a diagnostic probe (e.g. OES probe, or imaging probe, etc.) which is normally difficult to do with very compact ICM configuration. The diagnostic probe may diagnose the condition of the central anode, or the plasma. The conduit embedded with a plurality of working gas inlets is operably coupled to a perforated central anode tube, which may further include a design shade to protect the gas inlets from deposition flux.

A good anode connection is easily achieved by the 3-anode configuration leading to almost no voltage drop from the plasma to the anodes, 120, 132, and 134, especially as the end annular anode has larger inner diameter subject to a carousal holder 200 Outer Diameter (OD) size. The carousal holder 200, as shown in FIG. 8, may hold multiple substrates. In addition, it is also easier to adjust the central anode 120 size to achieve desirable cathode/anode surface area ratio for optimal operation. In one embodiment, the substrate may be biased on a continuous DC bias, between about 0-120V. Alternatively, the substrate may be biased with a pulsed DC bias between about 0-150 V and a frequency between about 1 Hz to 300 kHz.

A target cooling jacket 162 for easily clamping 2-half-circle tube target 170 also serves as the cathode 160, as shown in FIG. 4. A seamless cylindrical tube target is very costly at large sizes. Even sheet rolling into nearly full circle tube can be very costly as well. For some special materials such as Nitinol, it is economically impractical to make large size tubular target. With each half-circle tube piece that is precisely shape set, the two axial seams after mechanical clamp have negligible impact on target sputtering process. And thermal expansion during deposition process can further reduce the seam gap so that there is no plasma penetration. Assuming cooling jacket at room temperature, if a vacuum gap is used, temperature difference ΔT≈(target OD−jacket ID)/(target thermal expansion coefficient*target OD). So the target temperature can be controlled by setting the gap size (target OD−jacket ID). If certain heat conducting media is used, by applying heat conducting Fourier law on cylindrical shell, target temperature can be estimated and controlled. The heat conducting rate is given by equation (1):

$$\frac{dQ}{dt} = 2k\pi l(T1 - T2) \Big/ \ln\left(\frac{R2}{R1}\right) \quad (1)$$

where k: material conductivity; R1: inner radius, R2: outer radius; T1: target temperature, T2: jacket temperature, and l: length.

Figure 6A:
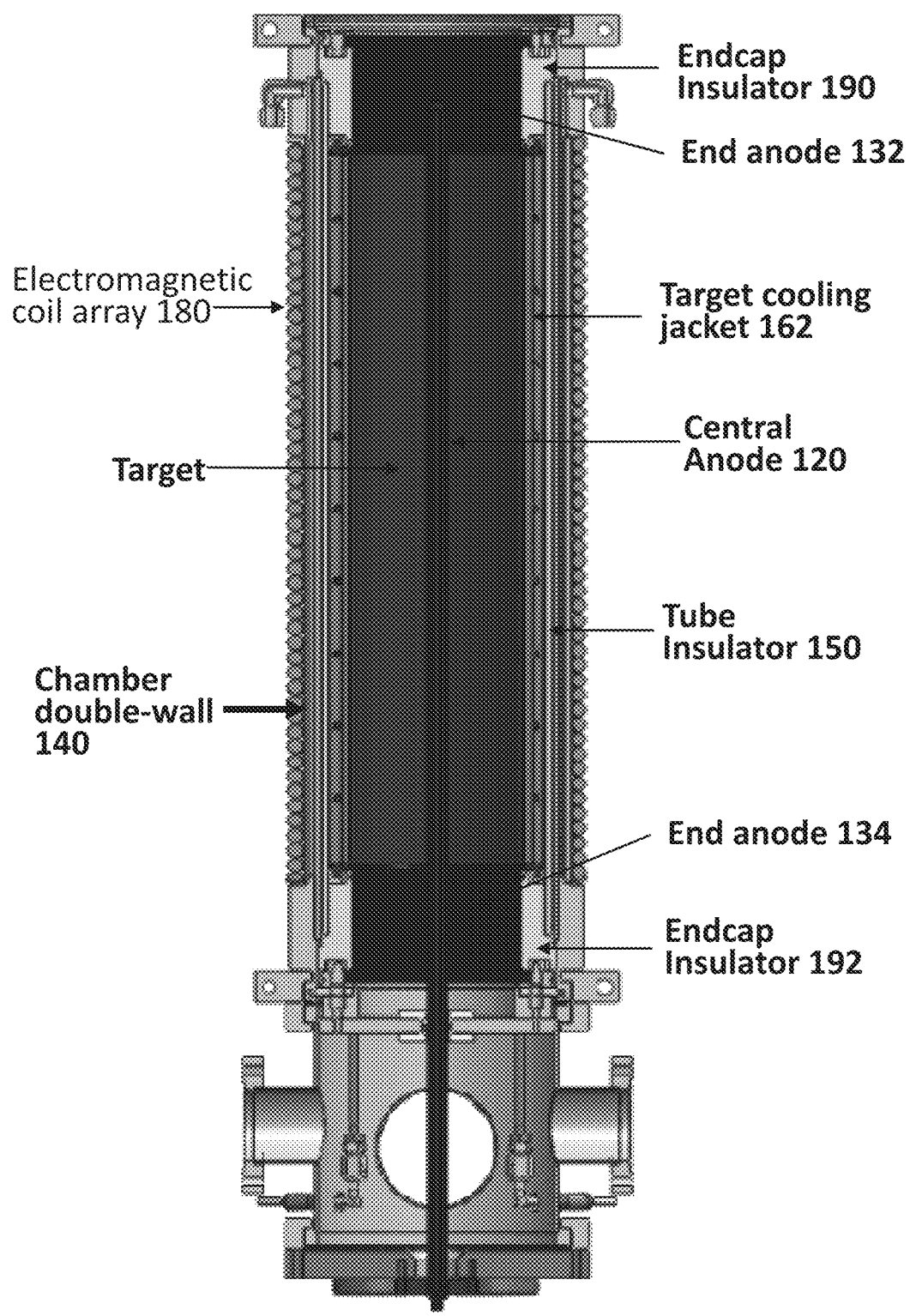
FIGS. 6a-6b are schematic cross-section drawings of the inverted cylindrical magnetron (ICM) source design for multiple-tubular-substrate operation.

FIG. 1a shows the use of electrically insulated tubular components to isolate the chamber wall 140 from the cathode 160 and target 170 to improve operation safety and reduce electrical complexity. As shown in FIG. 6a, a first electrically insulated end cap 190 and a second electrically insulated endcap 192 coaxially surround the first anode 132 and the second anode 134, respectively, at each end of the chamber double-wall 140. The first and second electrically insulated end caps 190, 192 coaxially fit within the first and second ends 142 and 144 of the chamber double wall 140. The first and second electrically insulated end caps 190, 192 serve for better electrical insulation and eliminate any contamination that may result from minor sputtering of the cathode flanges if made of metallic materials.

Figure 6B:
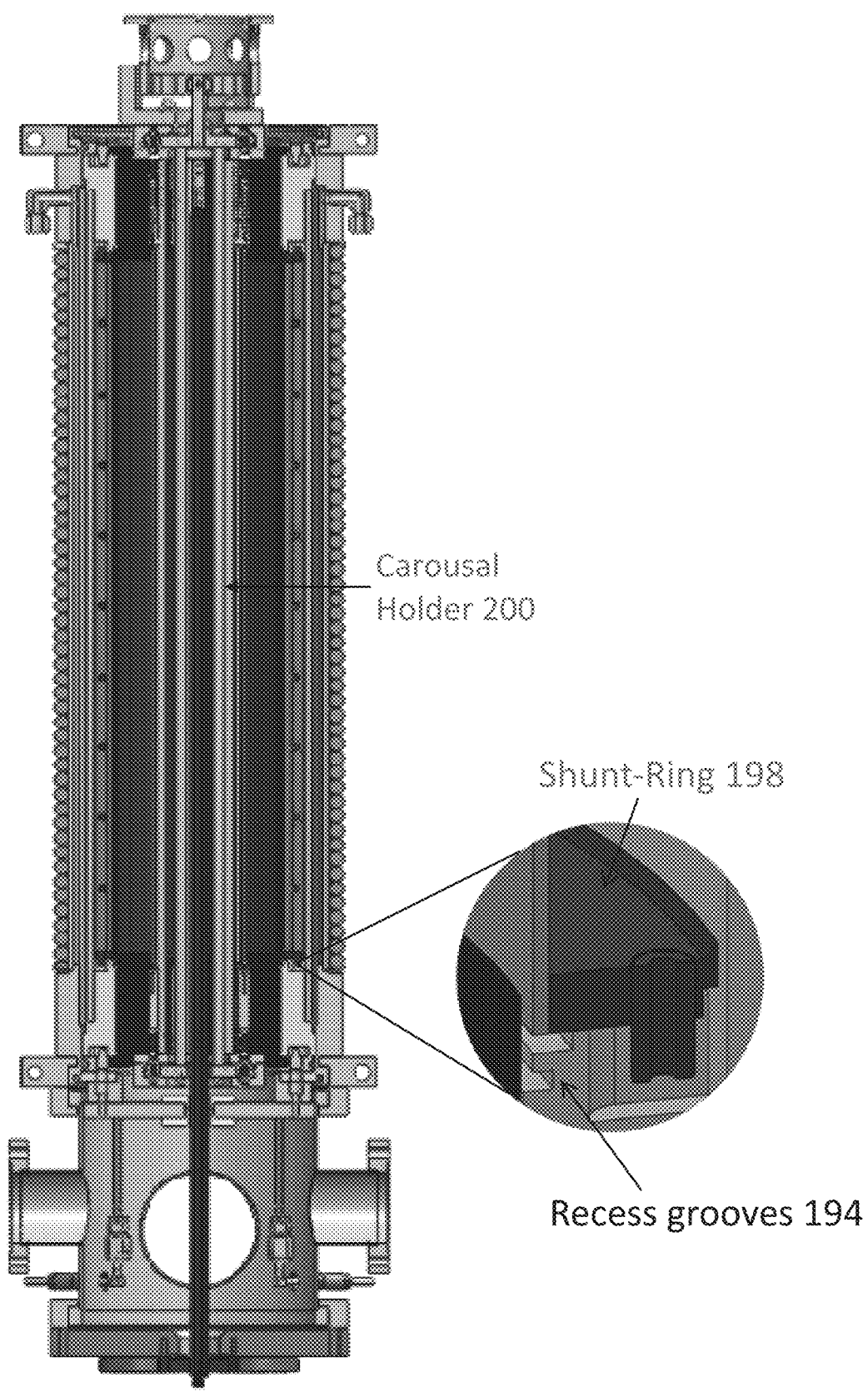

As shown in FIG. 6a, the deposition chamber includes the electromagnetic coil 180 attached at chamber wall 140 OD surface. The double-layer chamber wall 140 serves as cooling jacket for the electromagnetic coil 180 as well as the deposition chamber. The deposition chamber is electrically insulated from cathode by a tube insulator 150, which may be made of ceramic or quartz materials. The tube insulator 150 is coaxially disposed over the target cooling jacket 162. The target clamping & cooling jacket 162 serves as cathode of the magnetron source. The central anode 120, top-end anode 132 and bottom-end anode 134 provide the uniform electrical field. And the first and second electrically insulated end caps 190, 192 are made of electrically insulating materials to confine/block plasma and unwanted deposition loss When first and second electrically insulated end caps 190, 192 are used, electron "end losses" is eliminated through mechanically reflection by the endcaps and entrapment by proper shaping of magnetic field at the ends, the multi-zone electromagnetic coil 180, and a shunt-ring 198 disposed between the target cooling jacket 162 and the electrically insulated end cap 192 (same for 190), as shown in FIG. 6b. A special recessed feature 194 at top portion of the Inner Diameter (ID) of the electrically insulated end cap 192 (same for 190) surface helps avoiding un-wanted metallic deposits that may lead to electrical short.

Figure 4A:
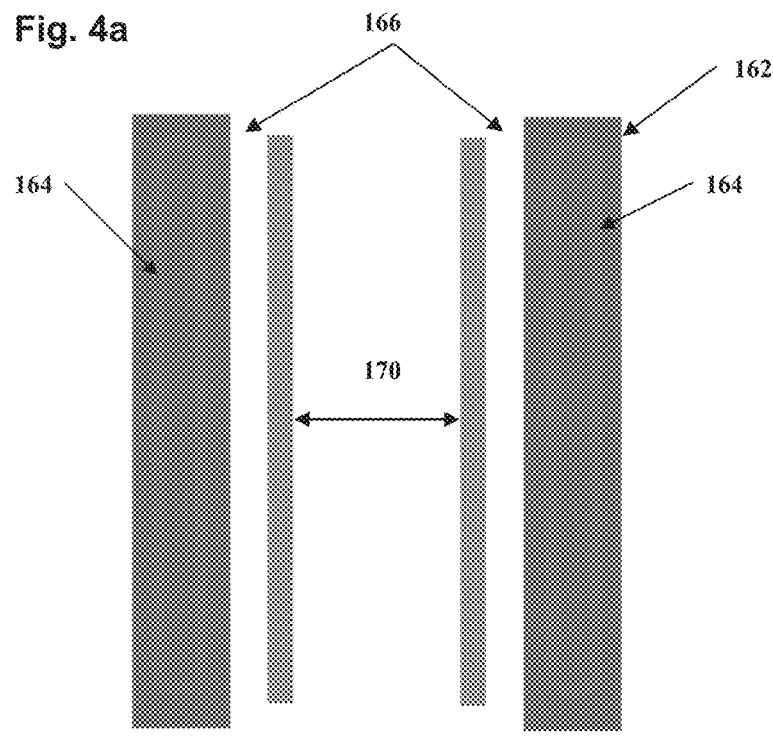
FIGS. 4a-4c are schematic cross-sections of the target temperature control and cooling jacket design.
Figure 4B:
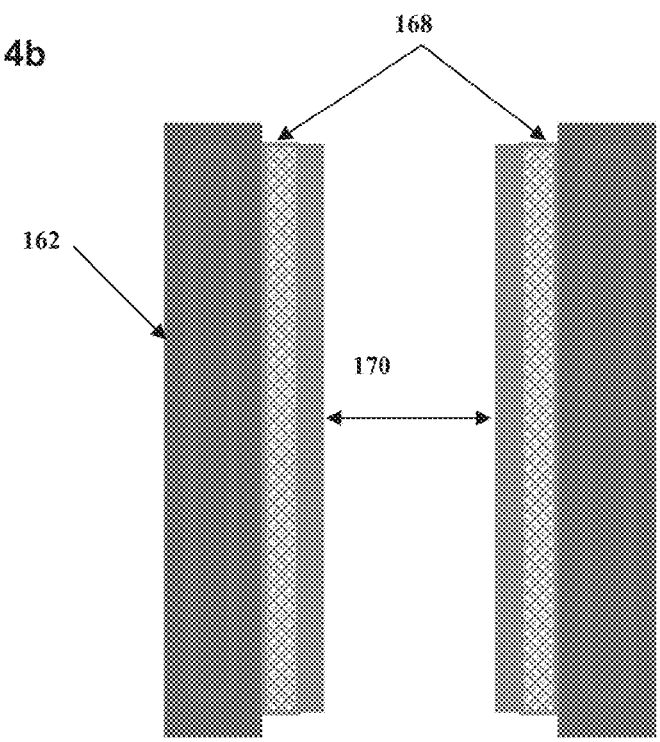

As shown in FIGS. 4a-4b, the target temperature controlled jacket 162 includes embedded cooling channels 164. In one embodiment, the embedded cooling channels 164 include a circular or quadrilateral shape within the target temperature controlled jacket 162. The target temperature has direct impact on sputtering yield and angular distribution. For multicomponent target materials, the impact can be very significant such that the target temperature control may become very critical to precise control of sputtering yield and deposition stoichiometry. Target cooling provides an effective way to control target temperature while improves throughput by lifting max allowable power limit and reducing time to reach steady-state condition especially for ICM source due to very compact source and chamber size. Target cooling temperature can be directly adjusted through the embedded cooling channels 164 with a coolant (water, or CDA, or liquid $N_2$), flow rate, and chiller temperature setting, or indirectly adjusted via thermal coupling between the target 170 and the target temperature controlled jacket 162. Various options of the contact can be utilized for temperature control such as direct contact, or indirect contact with a thermal conducting medium 168 disposed in-between the target 170 and the target temperature controlled jacket 162. Thermal conducting media 168 of different configurations & dimensions, such as perforated metal sheets or even vacuum spacing 166 between the target 170 and the target temperature controlled jacket 162 may be used to achieve different temperatures.

Figure 4C:
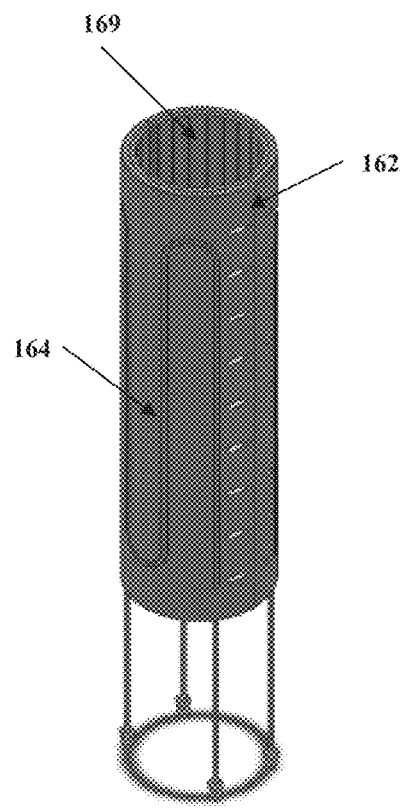

As shown in FIG. 4c, target temperature controlled jacket 162 includes at least two half-circle tubes with adjustable tightness for easily and securely clamping tubular targets 170 (seamless, welded, or 2 half-circle tubes). In one embodiment, the target temperature controlled jacket may be constructed from stainless steel (304, 316 series) to improve temperature uniformity. In addition, the stainless steel is biocompatible material that has no contamination issue for medical device applications. The target temperature controlled jacket includes small axially oriented grooves 169 on the inner diameter surface of the jacket to help accelerate vacuum pumping by eliminating potential virtual leak (entrapped gaseous species) due to tight contact of large cylindrical surfaces.

Figure 2A:
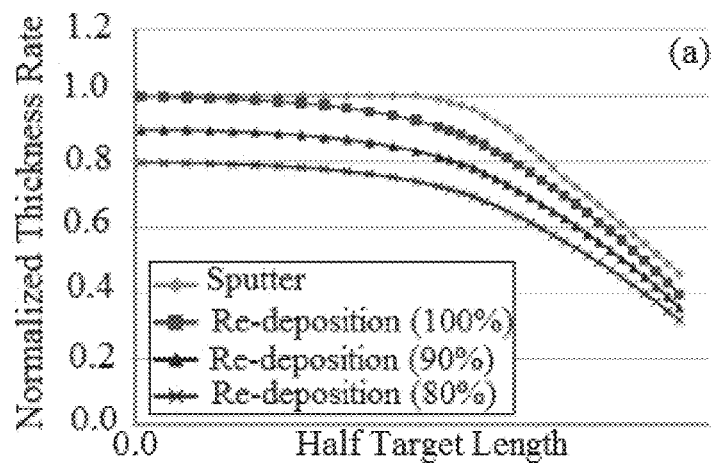
FIGS. 2a-2b are graphs showing non-uniform target erosion resulting from target re-deposition inherently in ICM magnetron.
Figure 2B:
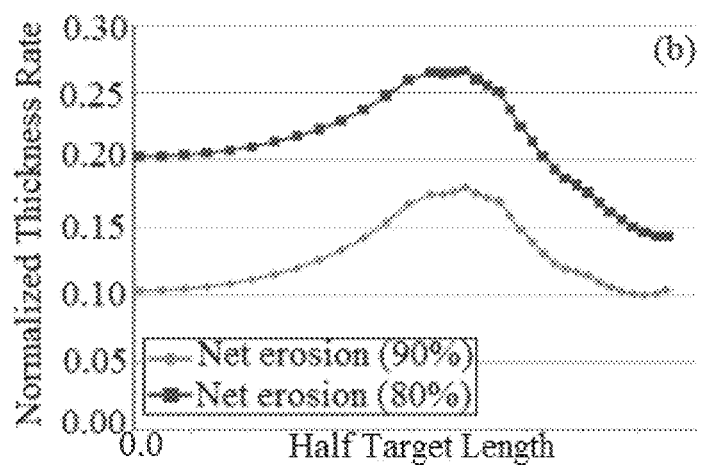

Non-uniform target erosion resulting from target re-deposition is shown in FIGS. 2a-2b. In case of ICM sputtering, there is considerable re-deposition on sputtered target surface that significantly affects target net erosion uniformity. Non-uniform target erosion not only reduces target utilization (life time) but also tends to cause deposition non-uniformity. Based on assumption that target sputtering rate is proportional to axial magnetic flux density and the sputtered species have cosine distribution, a simple model on target erosion under uniform magnetic flux density profile (except tapered off toward two ends) shows that re-deposition attributes significantly to the non-uniform target net erosion. Blocking the re-deposition by substrate array through substrate holder design is a very logical and effective solution. However, in reality it is difficult to fully block the re-deposition by substrates from mechanical design point of view. In addition, there are also some $2^{nd}$ order factors that may have impacts on target erosion non-uniformity.

Figure 3A:
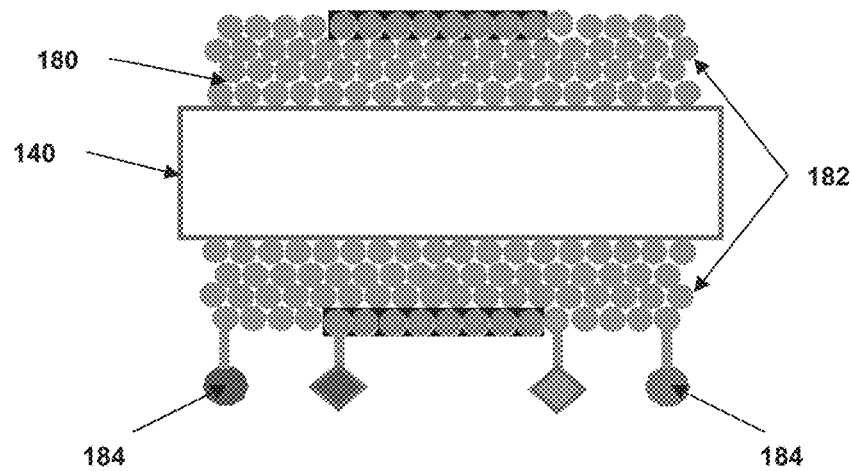
FIG. 3a is a schematic cross-section of the multi-zone electromagnetic coil design.
Figure 3B:
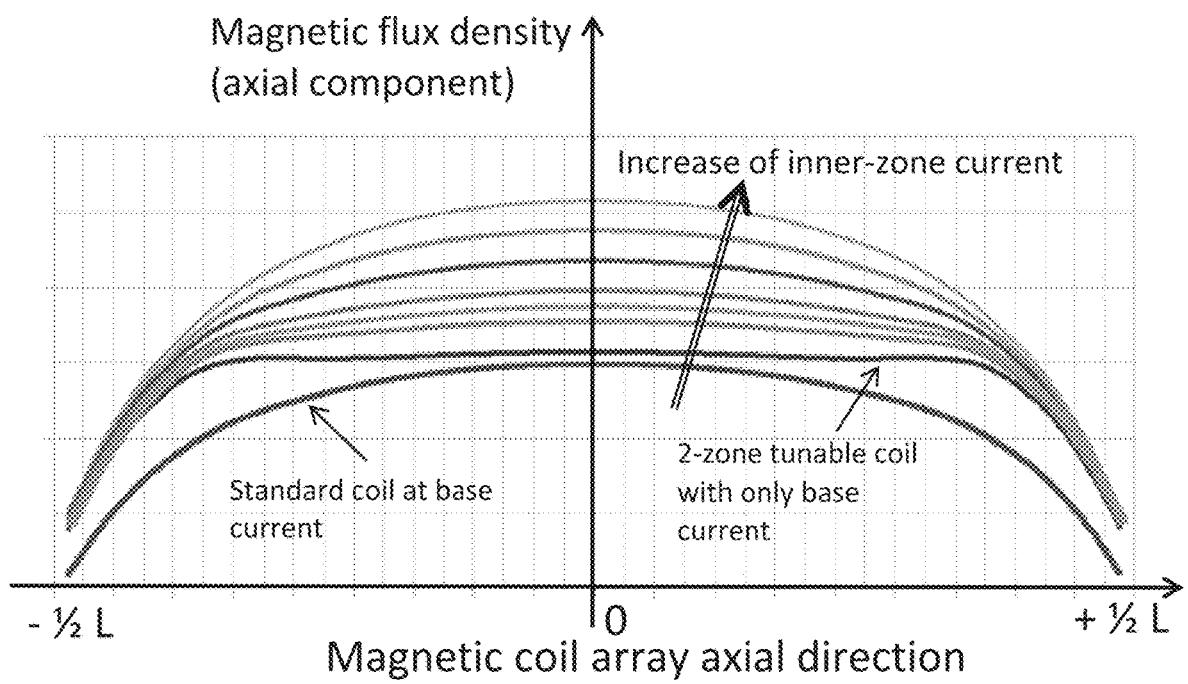
FIG. 3b is a graph of the simulation of tunable magnetic flux density profile.

Non-uniform target erosion and concept of multi-zone tunable magnets to shape magnet field, are shown in FIGS. 3a-3b to achieve uniform target erosion and film deposition. For plasma magnetron sputtering, axial component of magnetic flux density is utilized to confine electrons for ionization near target surface with a typical range between about 100-400 Gauss. Solenoid type electromagnetic coil provides a very easy and low cost way especially for ICM configuration to shape magnetic field profile. Hybrid magnets made of permanent magnet-rings and electromagnetic coil can be also easily implemented if needed.

As shown in FIG. 3a, the multi-zone electromagnet 180 includes a plurality of windings 182 formed on the water-cooled chamber wall 140 that is insulated from the cathode 160. Each winding 182 represents a plurality of coils. Each coil can have different number of wiring layers and be individually powered or be operated in electrical series connection with other coils. More advanced design of coil winding can be such that within each zone of the coil (especially the full length coil) there is variation of plurality of coil layers in order to achieve any desirable magnetic field profile while smoothly integrated with other coils. In any case, change of magnetic field profile has to be managed properly in order to avoid any unequal heating.

Since normally mirrored magnetic field profile along the axial direction is sufficient for ICM source, the multi-zone electromagnet 180 includes at least two tunable zones with individual power supplies 184, as shown in FIG. 3a. The two tunable zones can be used for tuning with either one of the following options: (1) full length main coil (power supply-1, for the best axial uniformity of magnetic field)+middle coil (centered symmetrically, power supply-2, for minimizing target re-deposition induced non-uniformity); or (2) full length main coil (power supply-1, for the best axial uniformity of magnetic field)+two mirrored end coils (two end coils in electrical series, power supply-2, for minimizing target re-deposition induced non-uniformity). By just implementing the simple 2-zone coil design (Option-1) in small size prototype system, target life has shown over 25% increase due to increased erosion uniformity, plus film stoichiometry and thickness uniformity also shows significant improvement. Target life time increases are calculated by comparison of the nominal one vs. the improved one. Improvement of film composition (e.g. phase transformation temperature Ar for NiTi film) and thickness are observed based on process data.

Figure 6C:
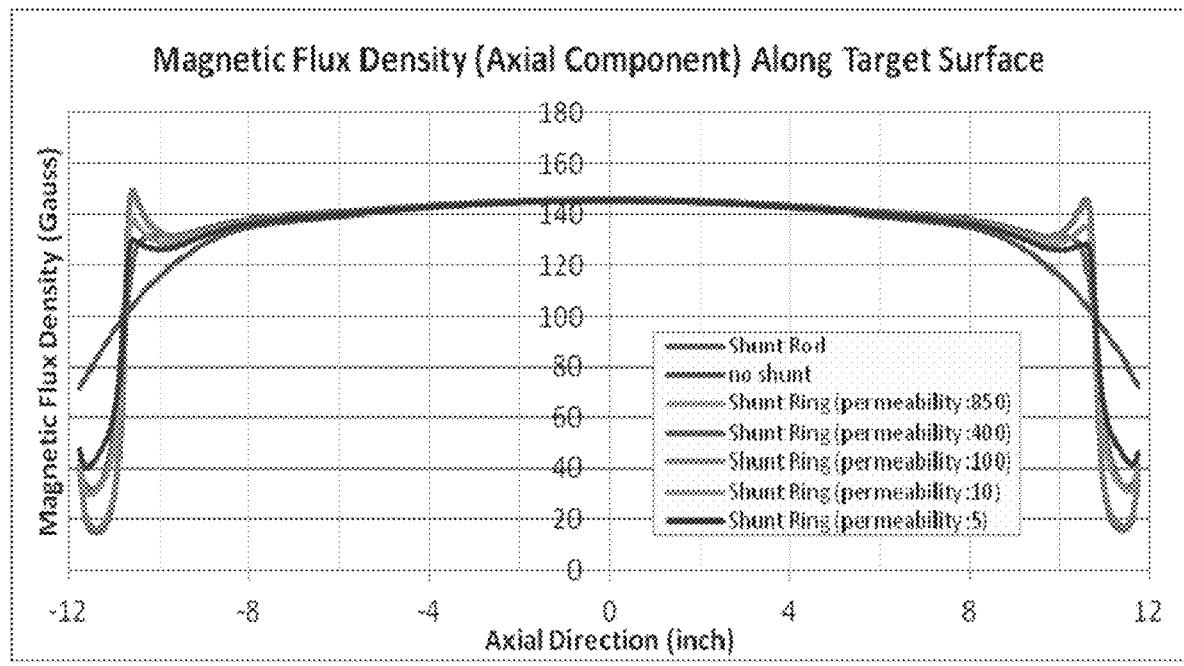
FIG. 6c is a graph of the magnetic flux density profiles along axial direction using different shunt ring materials.

By some increase of magnetic field strength at two ends, the "end loss" of high energy electron can also be avoided. In addition, a shunt ring 198 coaxially disposed between the end insulator caps 190, 192 and the target cooling jacket 162, as shown in FIG. 6b at each end can provide better termination of magnetic field profile as well as elimination of end loss. The shunt ring may modify the magnetic field, whereby the shunt ring including a magnetic permeability and specified geometry. As shown in FIG. 6c, the axial direction magnetic flux density along the target surface obtains a more uniform profile at two ends with permeability of the shunt ring material from about 5 to about 900. Further improvement can be achieved by optimization of its geometry. The cross-section may be rectangular or circular. The radial direction size (e.g. ring width) may be between about 0 to 2 inches, alternatively the thickness may be between 0 to 1 inches. The material may be vacuum compatible stainless steel of appropriate permeability values, in one embodiment, which also contributes to permeability.

Electromagnets provide an effective way to tune magnetic flux density such that the target erosion, film deposition composition and uniformity can be adjusted. In addition, the electromagnets shape magnetic field profile in order to eliminate end losses of high energy electrons to anode. The tunable magnetic flux density profile is very effective to minimize target erosion non-uniformity resulted from the re-deposition and other factors (e.g. gas low and pressure, etc.). Multiple-zone coil design provides more flexibility of shaping the magnetic field profile to compensate for hardware and process related non-uniformity along the axial direction.

Adjustment of substrate-to-target distance as a tuning knob for film stoichiometry as well as thickness uniformity control is achieved via use of different size carousal holder 200 design based on substrate size and gear size. In one embodiment, the substrate-to-target distance may be between 0.5" to 2.0" by using different holder designs and tuning of the same.

Figure 7A:
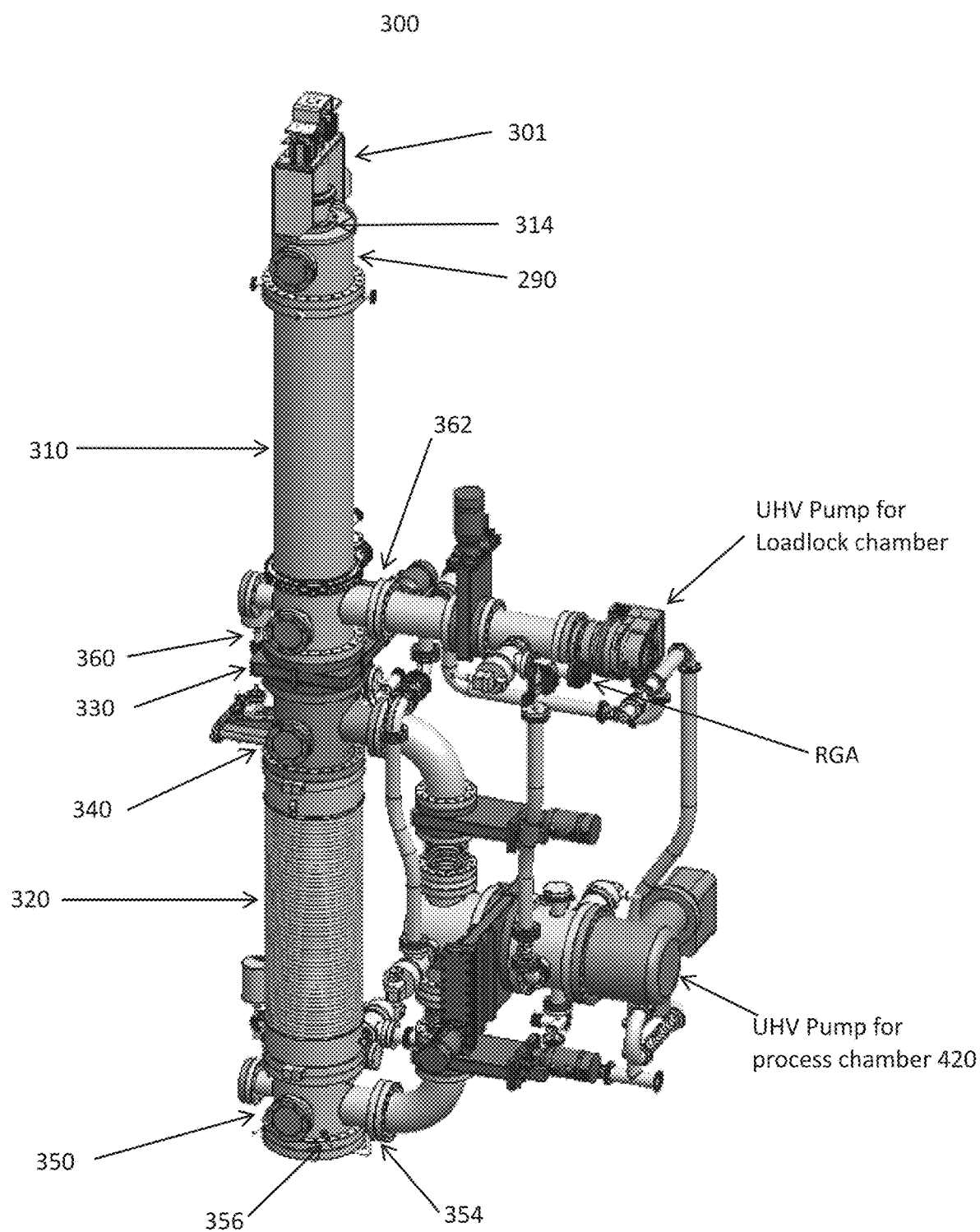
FIG. 7a is a perspective view of the single-Chamber system.

One embodiment is a single ICM-chamber system design 300, as shown in FIG. 7a. The single ICM-chamber system design 300 comprises a linear-transfer loading mechanism 301 with push-pull cam gripper connected to a motorized leadscrew stage (not shown) for transporting the substrate carousal holder 200 (not shown) between the loadlock chamber 310 and a process chamber 320. A lip-sealed and differentially pumped feedthrough 314 is disposed on the distal end of the linear-transfer loading shaft (not shown) and the loadlock chamber 320 for enhanced vacuum seal and longer mean time between maintenance as compared to conventional o-ring based feedthrough. Compared to other high performance feedthrough such as magnetic feedthrough, this lip-seal mechanism is much simpler, with no extra length requirement. The lip-sealed feedthrough 314 is shown in FIG. 7e, and the linear-transfer loading mechanism 301 with cam gripper is shown in FIG. 7f.

As shown in FIG. 7a, the loadlock chamber 310 for substrate loading and pre-clean includes at least two venting/purging gas inlets, an electrical feedthrough and a carousal holder gripper. Substrate pre-clean can be done by simple lamp heating or more sophisticatedly by sputtering clean. A top cross-way chamber 360 with a pumping port 362 (pumping down the loadlock chamber), and a viewport. A main gate valve 330 operably coupled to the bottom of the cross-way chamber 360 completely seals the process chamber 320 during deposition and helps maintain high vacuum environment for the process chamber 360 during non-deposition times. A rotation cross-way chamber 340 with rotation driving mechanism, an electrical feedthrough, a pumping port and a gas inlet is disposed on the bottom of the main gate valve 330 and on top of the process chamber 320. A bottom cross-way chamber 350 is disposed on the bottom end of the process chamber 320, and the bottom cross-way chamber 350 includes a gas inlet, a viewport, a pumping port 354, an electrical feedthrough for main power supply and a target cooling water feedthrough 356, as shown in FIG. 7a. (Equipment piping system with controllable gas flow and pumping not fully shown).

Figure 7B:
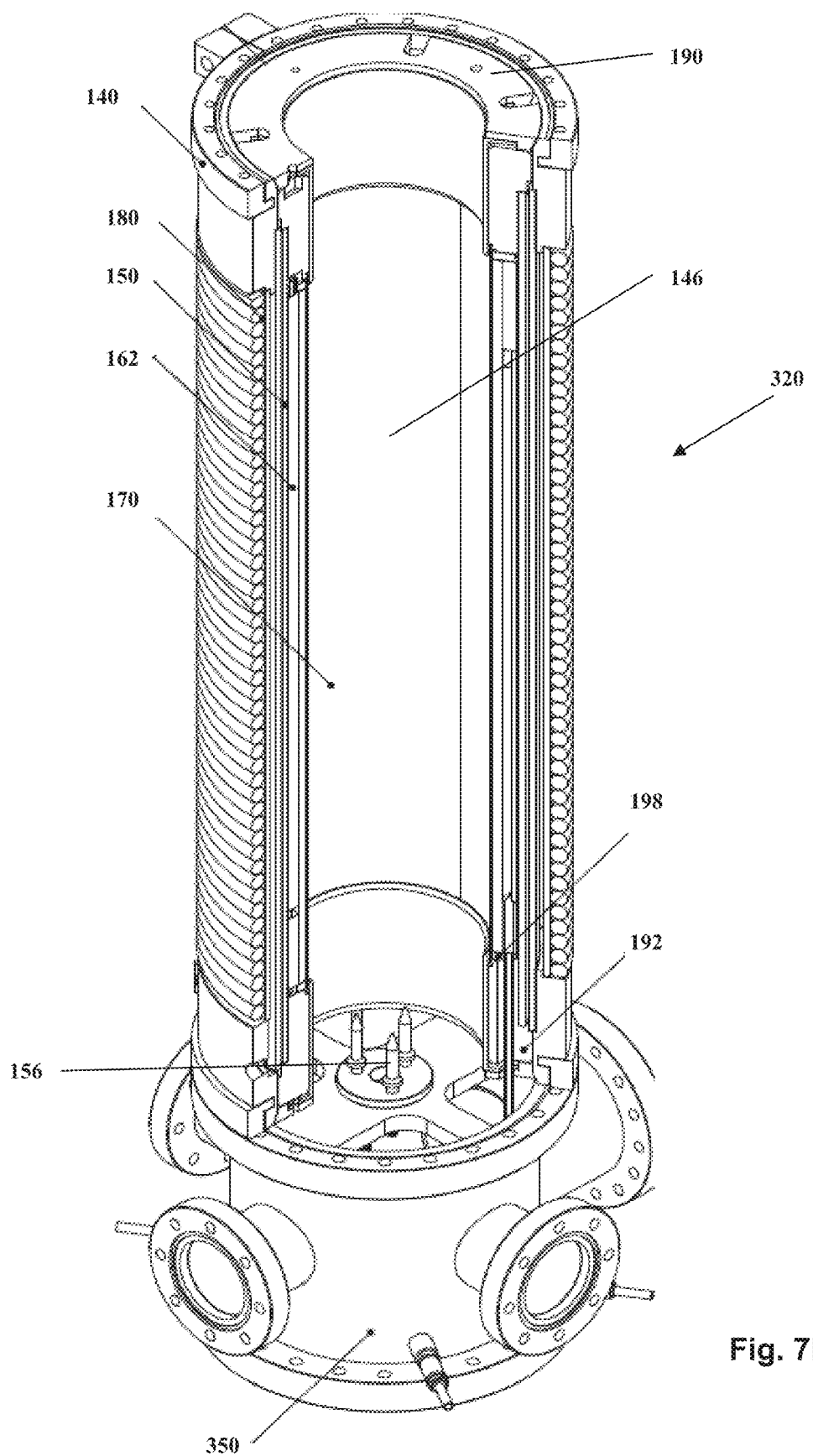
FIG. 7b is a perspective cross-sectional view of the process chamber system.

As shown in FIG. 7b, the process chamber 320 is coupled with the bottom cross-way chamber 350. The process chamber 320 includes the electromagnetic coil 180 coaxially disposed around the chamber double-wall 140, and chamber double-wall 140 coaxially disposed around the tube insulator 150, and the tube insulator 150 coaxially disposed around the target cooling jacket 162. The target 170 is disposed within the central annular space 146, while the shunt ring 198 is coaxially disposed on the ends of the process chamber 320 along with the endcap insulator 192 within the chamber wall 140. In one embodiment, a plurality of alignment pins 156 fix the carousal holder 200, as further detailed below.

Figure 7C:
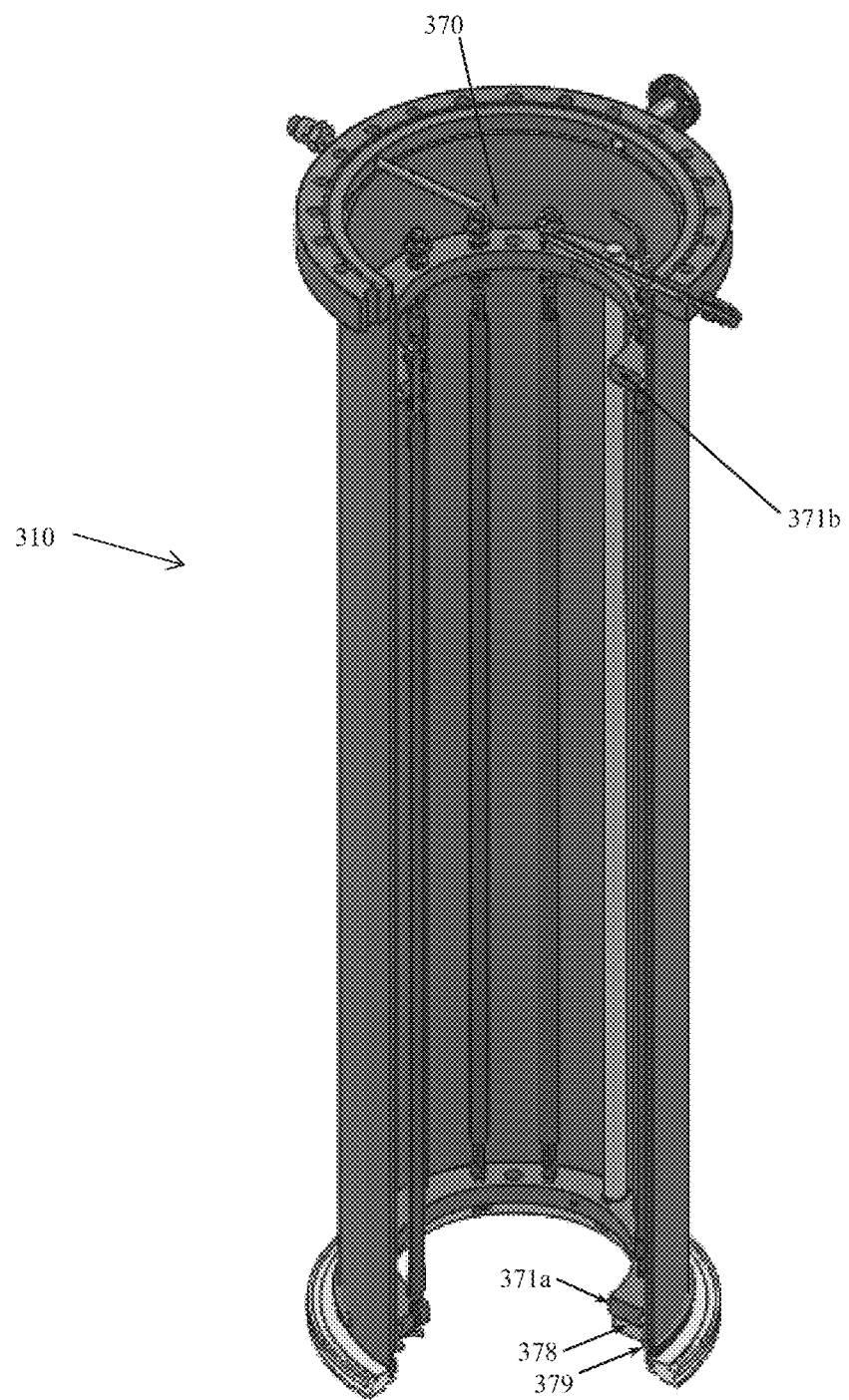
FIG. 7c is a perspective cross-sectional view of the heater lamp system inside loadlock chamber.
Figure 7D:
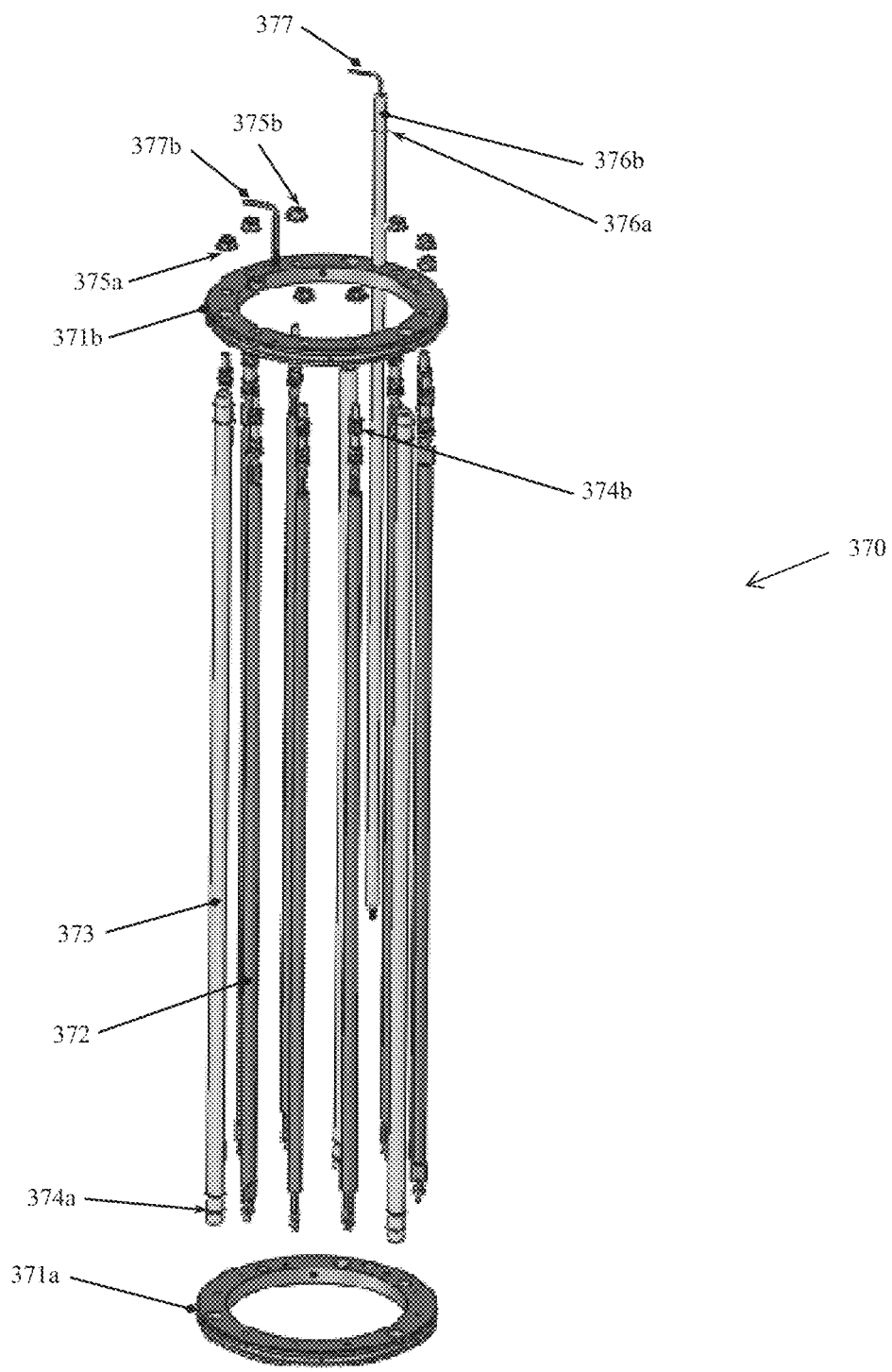
FIG. 7d is an exploded view of the heater lamp system.
Figure 7E:
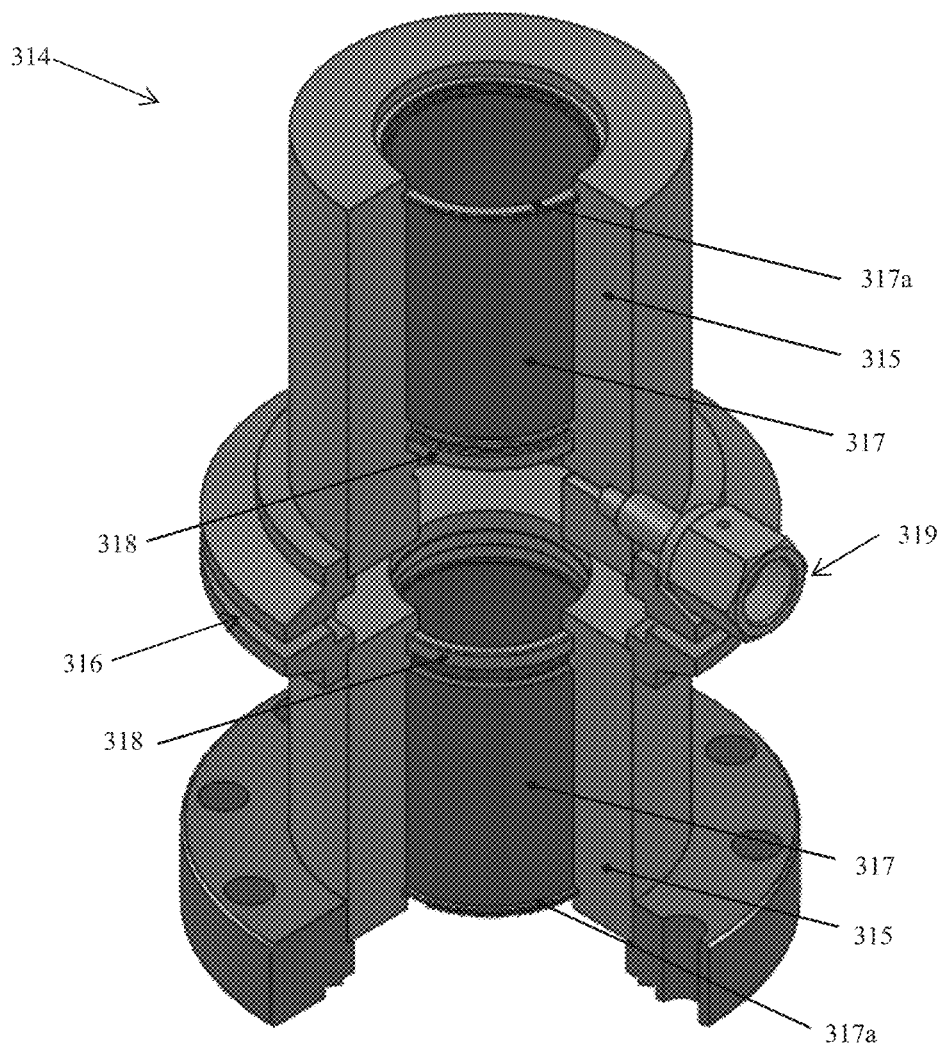
FIG. 7e is a perspective cross-sectional view of the lip-sealed linear feedthrough.
Figure 7F:
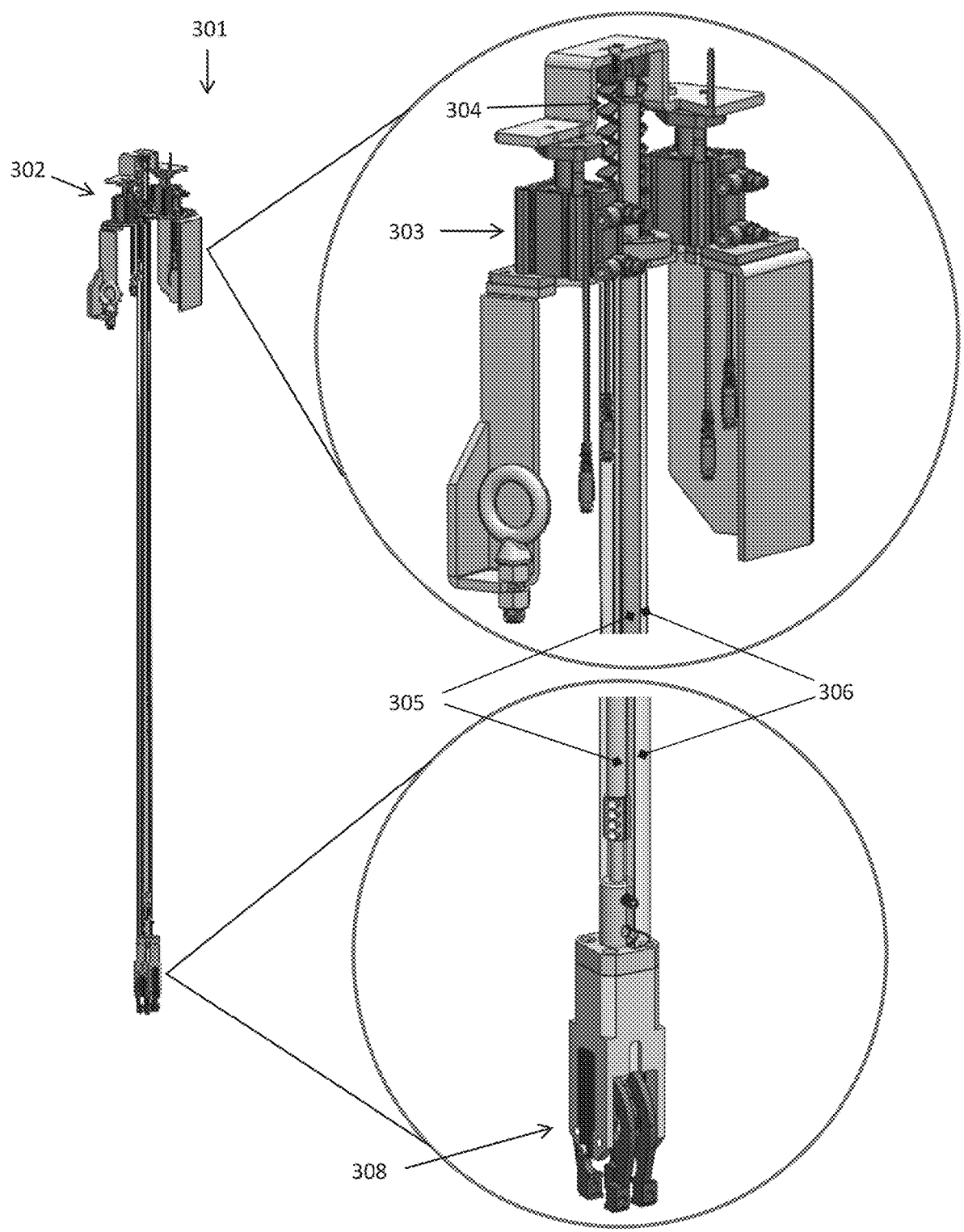
FIG. 7f is a perspective view of the bellow sealed linear-transfer loading mechanism with a cam gripper with enlarged views of the top end and the bottom end.

As shown in FIG. 7c, the loadlock chamber 310 for pre-heating the substrates, includes a lamp assembly 370 co-axially fitted within the loadlock chamber 310. The lamp assembly 370 is electrically insulated from the chamber wall by ceramic bead ring (not shown) around each end plate 371a and 371b as well as a ceramic insulation disk 378 supported by a retaining ring 379. As shown in FIG. 7d, the lamp assembly 370 includes a first and second circular end plates 371a, 371b that have a plurality of openings through which a plurality of heater lamps 372 are disposed. The heater lamps 372 are generally disposed on support shafts 373, that include a retaining ring 374a coupled with the first end plate 371a and a spring 374b coupled with the second end plate 372b to secure the support shaft 373 and heater lamps 372 therebetween. A plurality of washers 375a and nuts 375b may secure the end portions of the support shafts 373 to the end-plates 371a, 371b. A retaining ring 376a and a long ceramic insulation tube 376b may be coupled to a long electrical connector 377a to advance electricity to the second electrodes of heater lamps 372. Whereas a short electrical connector 377b mounted to end-plate 371b advances electricity to the first electrodes of heat lamps 372. The heat lamps 372 are tightly hosted by end connectors 374a and end connectors 374b with compression spring loads that can also accommodate thermal expansion mismatch during operation.

As shown in FIG. 7e, the lip-seal feedthrough 314 includes a pair of hollow shafts 315 operably coupled with—two standard ISO LF flanges co-axially disposed around the hollow shafts 315. A standard centering O-ring assembly (not shown) are placed between the two ISO LF flanges to form vacuum seal with differential pumping 319A pair of lip-seals 318 are coaxially disposed on the inner surface of the hollow shafts 315. At least two linear bearings 317 are coaxially disposed within the inner diameter of the hollow shafts 315, and are fixedly coupled to the hollow shafts 315 by at least two internal retaining rings 317a.

As shown in FIG. 7f, the linear-transfer loading mechanism 301 with a cam gripper at the bottom end includes a bellow sealed linear actuator 303 & 304 to provide push-pull operation of the cam gripper 308 at the bottom end distal via a solid linear shaft 305. The solid linear shaft 305 is concentrically inside a hollow linear shaft 306 which is securely attached to a motorized leadscrew stage (not shown) to transport the substrate carousal holder 200. Pneumatic push-pull actuation of the cam gripper 308 is therefore provided by two air cylinders outside the vacuum chambers 290 & 310 with use of the bellow sealed linear shift device 303. Whereas standard cam gripper has an integrated pneumatic compartment that is not safe for use inside high vacuum chamber.

Figure 8D:
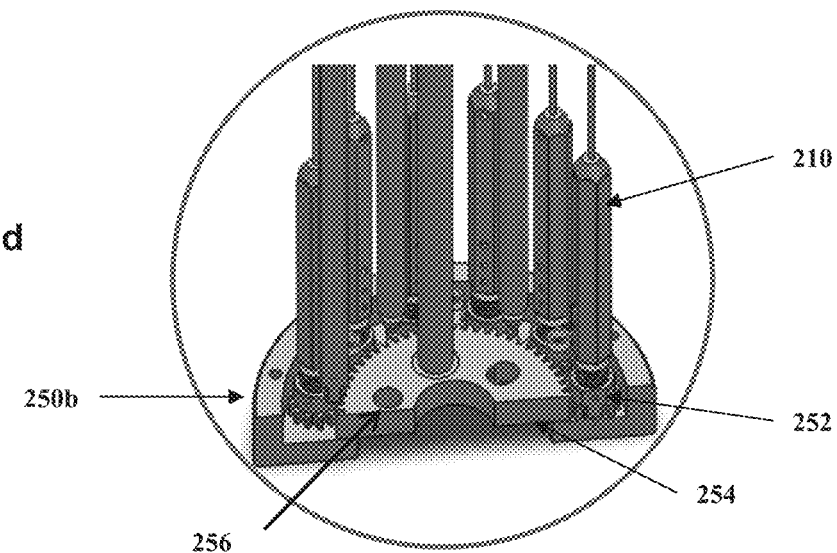
FIG. 8d is a schematic cross-section perspective view of the bottom portion of the carousal holder.

As shown in FIGS. 8a-8d, the carousal holder 200 includes a gear planetary rotation mechanism 220 operably coupled to substrate/mandrel holders 210. The gear planetary rotation mechanism 220 generally includes a plurality of satellite gears 222 that are rotatably coupled around a central sun gear 224 while self-spinning to provide planetary rotation for the substrate holders 210 that are mounted coaxially onto the satellite gears 222, as shown in FIG. 8c. As such in FIG. 8b, the satellite gears 222 are driven by top case enclosure 250a that is locked via a rotation key 240 onto rotation gear sub-assembly driven by a servo motor (not shown). The servo motor is program controlled for rotation speed as well as torque limit as a safety interlock. It will execute a homing operation after each run is completed so that the carousal holder 200 with substrates can always return to the same rotational orientation and position for every loading & unloading operation.

As shown in FIG. 8d, the carousal holder 200 includes a holder bottom case enclosure 250b connected to the top case enclosure 250a via a plurality of solid supporting rods 215 that transmit rotation from the top to the bottom. The holder bottom mount 260 includes a plurality of satellite gears 252 rotatably coupled around a bottom sun gear 254. The plurality of satellite gears 252 are fixedly associated with the substrate holders 210, as to convey aligned rotation coupling from the top satellite gears 222. The bottom sun gear 224 includes a plurality of alignment holes 256 and alignment of the carousal holder 200 to the magnetron central axis is achieved by locking alignment holes 256 at a holder bottom sun gear 254 to the 3 fixed alignment pins 156 at chamber bottom support plate (FIG. 7B). In addition, carousal holder top central fixture 230 co-axially aligned to the rotation cross way chamber 340 is used to fix the top sun gear 224 into a set angular orientation position that is aligned to the bottom sun gear orientation position. The two sun gears are co-axially aligned and connected by 3 solid supporting rods (not shown), such that twist-free holder rigidity can be guaranteed during operation.

An adjustable spring loading fixture 212 is used to apply tension to substrate holders 210 during deposition in order to eliminate substrate bowing deformation that may occur in high temperature environment. To minimize friction and wear/galling under high temperature operation environment, gears and bearings are made of non-magnetic materials with good galling resistance and high vacuum compatibility.

The number of substrates and substrate-to-target distance are set by each individual holder design. Depending on substrate size, it is very feasible to accommodate more number of substrates than shown in FIGS. 8a-8d if with very compact and custom design gears. Alternative holder design may implement continuously adjustable substrate-to-target distance, which may be accomplished by some lateral displacement mechanism coupled to the satellite gears allowing them to be laterally displaced towards the exterior circumference of the top holder plate.

The carousal holder 200 loading/unloading and rotation mechanism 220 operates by grasping the carousal holder 200 using the cam gripper 308 in the loadlock chamber 310. After the loadlock chamber 310 is pumped down to required vacuum base pressure (e.g. $1 \times 10^{-7}$ torr) and the substrate pre-bake or pre-clean is done, the carousal holder 200 is then loaded into process chamber 320. The gripper releases the carousal holder once the carousal holder reaches the process position, and then retracts to loadlock chamber 310. The carousal holder 200 then engages with homed rotation gear 273 at the top via pin-slot (pins of rotation locking key 240 into slots of rotation rotation gear 273) locking mechanism.

A gate valve 330 closes for processing. After processing is completed, the rotation gear is homed and the gate valve 330 is opened for unloading. The cam gripper comes down to grasp and lift up the carousal holder 200 to the loading position in the loadlock chamber 310 and then gate valve 330 is closed. The loadlock chamber 310 is then vented for unloading substrates.

Figure 8E:
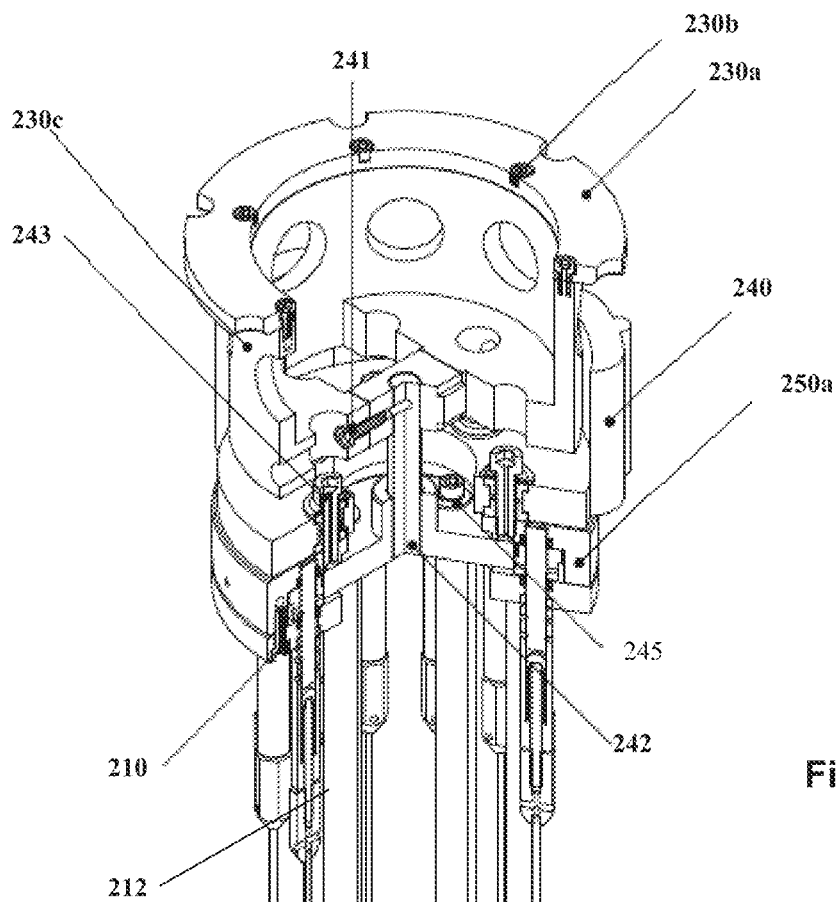
FIG. 8e is a cross-sectional perspective view of the planetary gear rotation and locking mechanism.

As shown in FIG. 8e, the rotation lock key 240 sits atop the top case enclosure 250a, and the fix-locking cap-230c sits atop the rotation key 240. The fix-locking cap 230c is mounted to a top locking mount 230a with a plurality of mounting screws 230b. By use of bolt 241, the fix-locking cap 230c holds clamp shaft 242 which is fixedly secured to the top sun gear 224 with a plurality of bolts 245 and set-screws (not shown), with a top case enclosure 250a therebetween. The rotation lock key 240 holds the top case enclosure 250a by the use of a plurality of bolts 243.

Figure 8F:
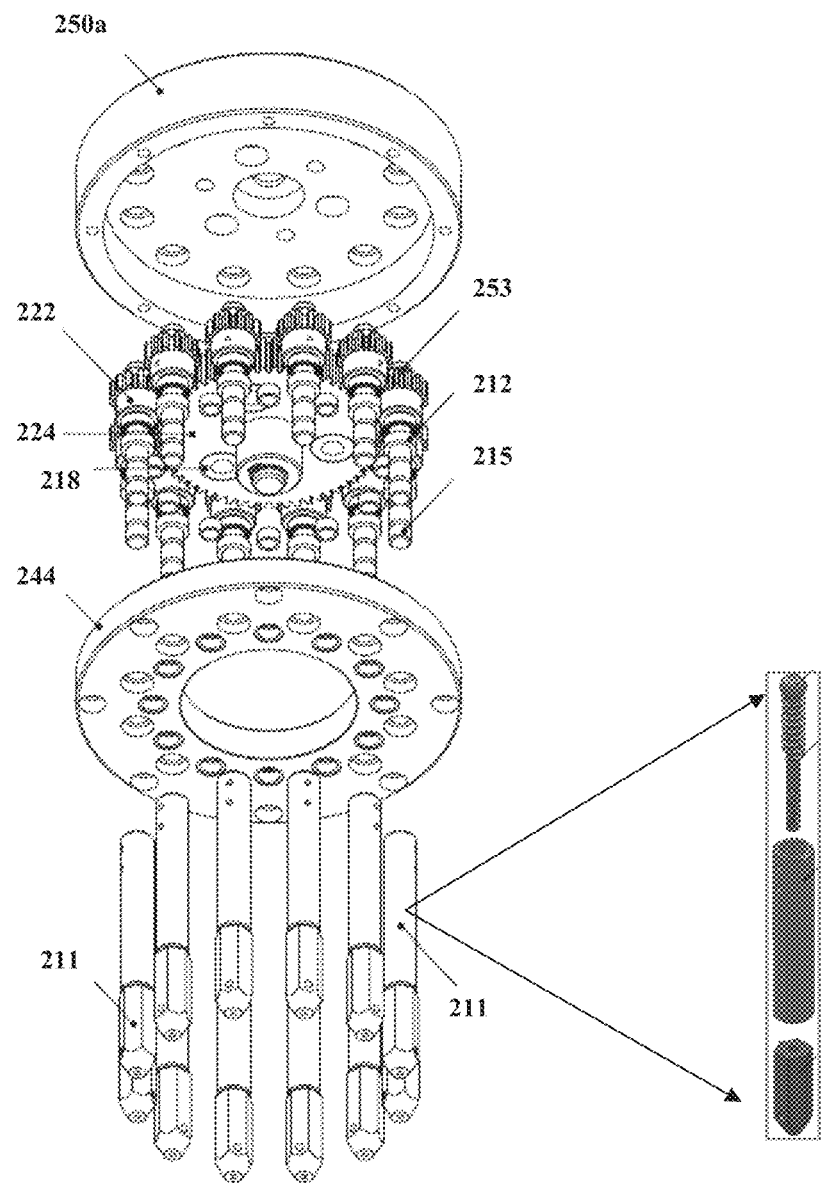
FIG. 8f is a exploded schematic view of the upper case enclosure, the sun gear and the satellite gears.

As shown in FIG. 8f, a circular mandrel housing cover 244 includes a plurality of openings to accommodate the spring loading fixtures 211 and is mounted to the top case enclosure with a plurality of screws. The ceramic tube spacer 212 is operably coupled with the satellite gear 222. A central sun gear 224 is operably coupled to the satellite gears 222, and is secured to the circular mandrel housing cover 244 by a plurality of ceramic tube spacers 212. The satellite gears 222 are operably coupled to the top case enclosure 250a by ball bearings 253.

Figure 8G:
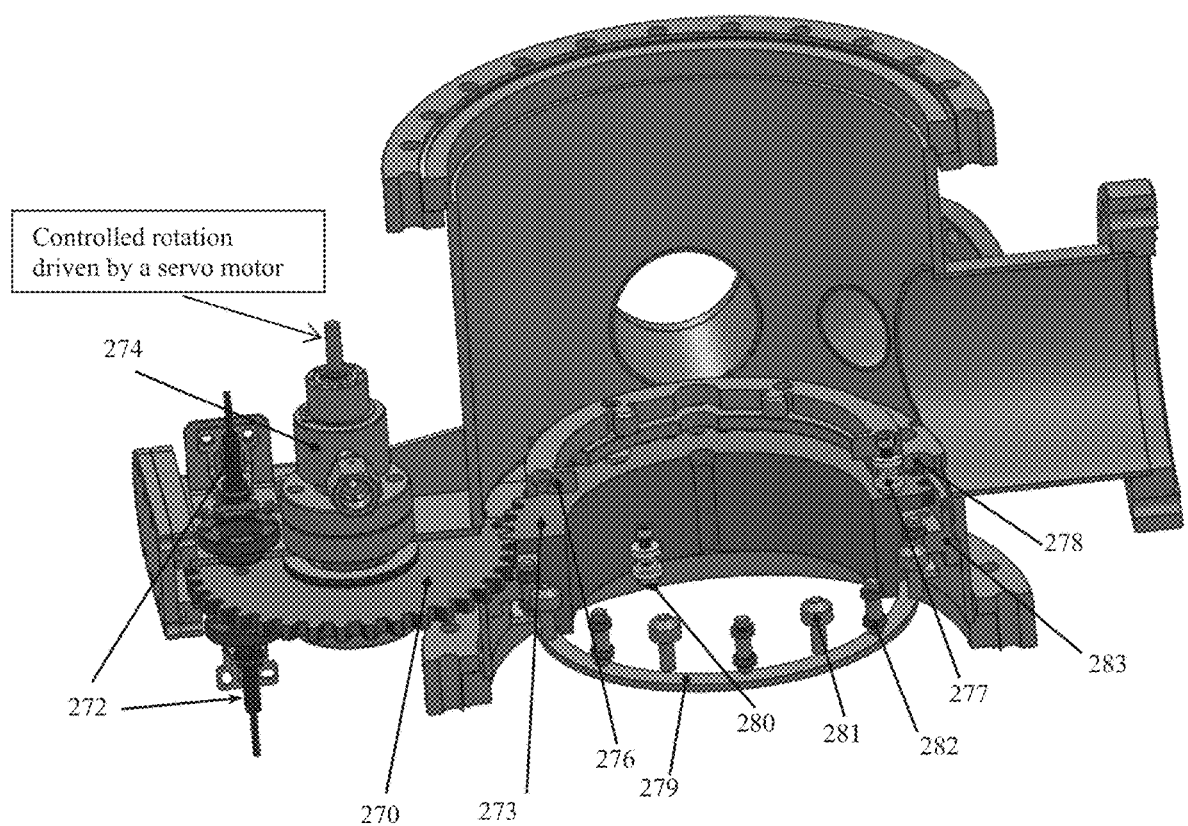
FIG. 8g is a cross-sectional perspective view of the spur gear operably coupled with the upper case enclosure and rotation feedthrough inside rotation chamber.

As shown in FIG. 8g, the carousal holder 200 rotates by operable coupling via rotation lock key 240 to a spur gear pair 270/273. A servo motor powers the spur gear 270 with rotation torque via a rotary feedthrough 274. The rotation locking plate 276 is attached with a plurality of ceramic flanges 277 and screw/nuts 280—onto a mandrel locking pin locating plate 278 which is fixedly secured to rotation place gear mount 283 welded to the chamber wall. The ceramic flanges 277 are used to electrically insulate the rotation locking plate 276 from the mandrel locking pin locating plate 278 and chamber wall as biasing power is advanced to substrates via the rotation locking plate 276 connected to an electrical feedthrough. A retaining ring 279 is to support a plurality of transfer ball bearings 281 and side ball bearings 282 that are secured by rotation place gear mount 283. A laser emitter/receiver device 272 is used for homing gear rotation position.

Figure 5:
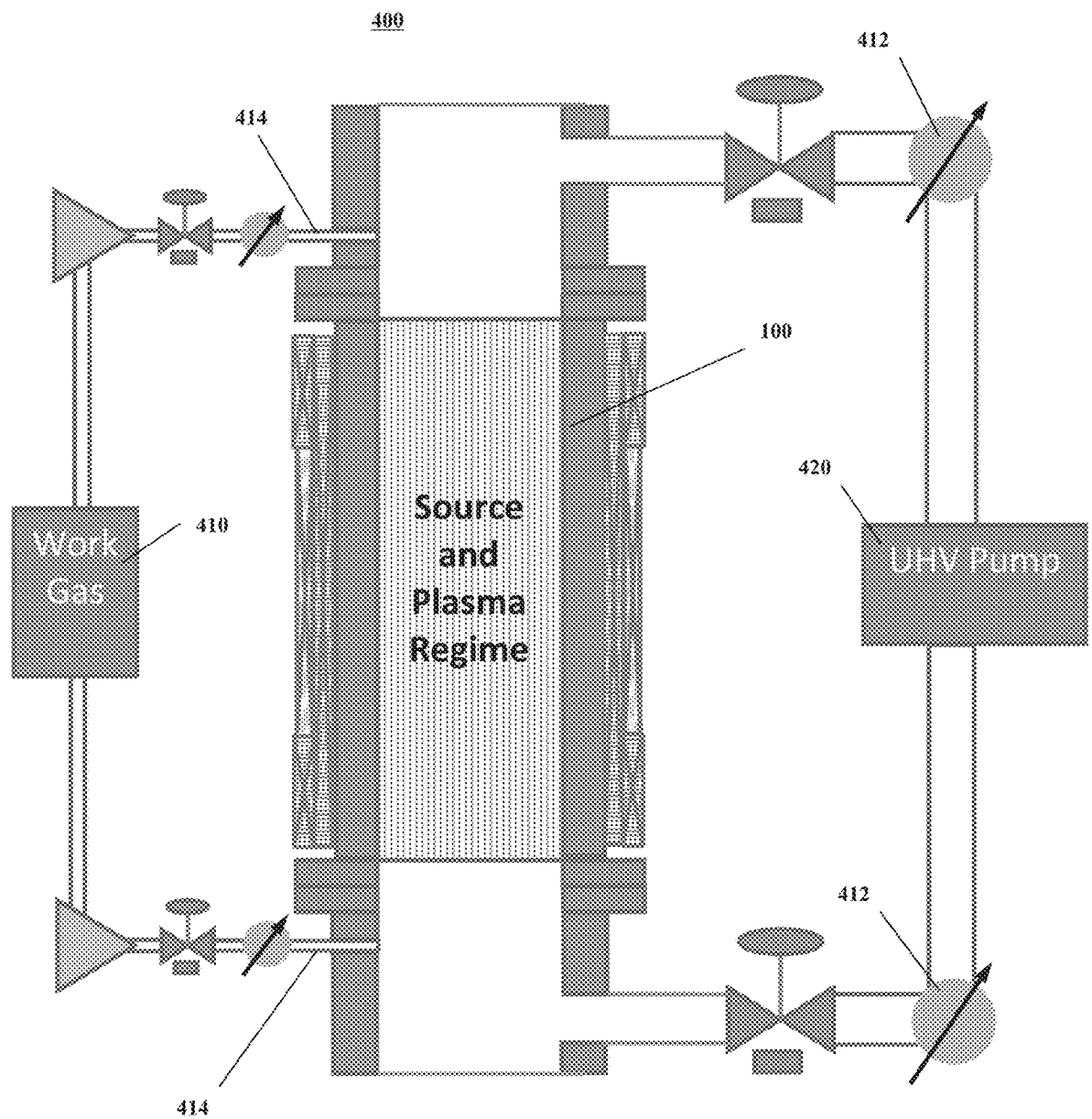
FIG. 5 is a schematic cross-sectional diagram of the balanced gas flows and pumps design coupled with the ICM.

The balanced gas flow and pumping design 400 is shown in FIG. 5. Multiple adjustable gas flow 410 and pumping routines 420 are implemented with the (ICM) source 100 to enhance deposition uniformity via establishing uniform gas flow and process pressure. In one embodiment, the controlled gas flow 410 is operably coupled with the top and bottom of the ICM source 100 at a certain ratio (flow rate or pressure) with pumping rate from each end controlled by a throttle valve 412.

In conventional art of magnetron sputtering deposition, only single routine of gas flow and pumping is available for equipment simplicity, which may be insufficient for demanding applications. In the case of single routine gas flow/pumping, ICM sources (especially those with high length-to-diameter ratios), have more severe gradients of pressure and flow rates than planar magnetron sputtering. This seems to have quite large impact on uniformity especially as most processes are conducted at low pressure conditions. Therefore, multiple gas flow/pumping routines with adjustable rates are critical to achieving high uniformity.

Figure 9A:
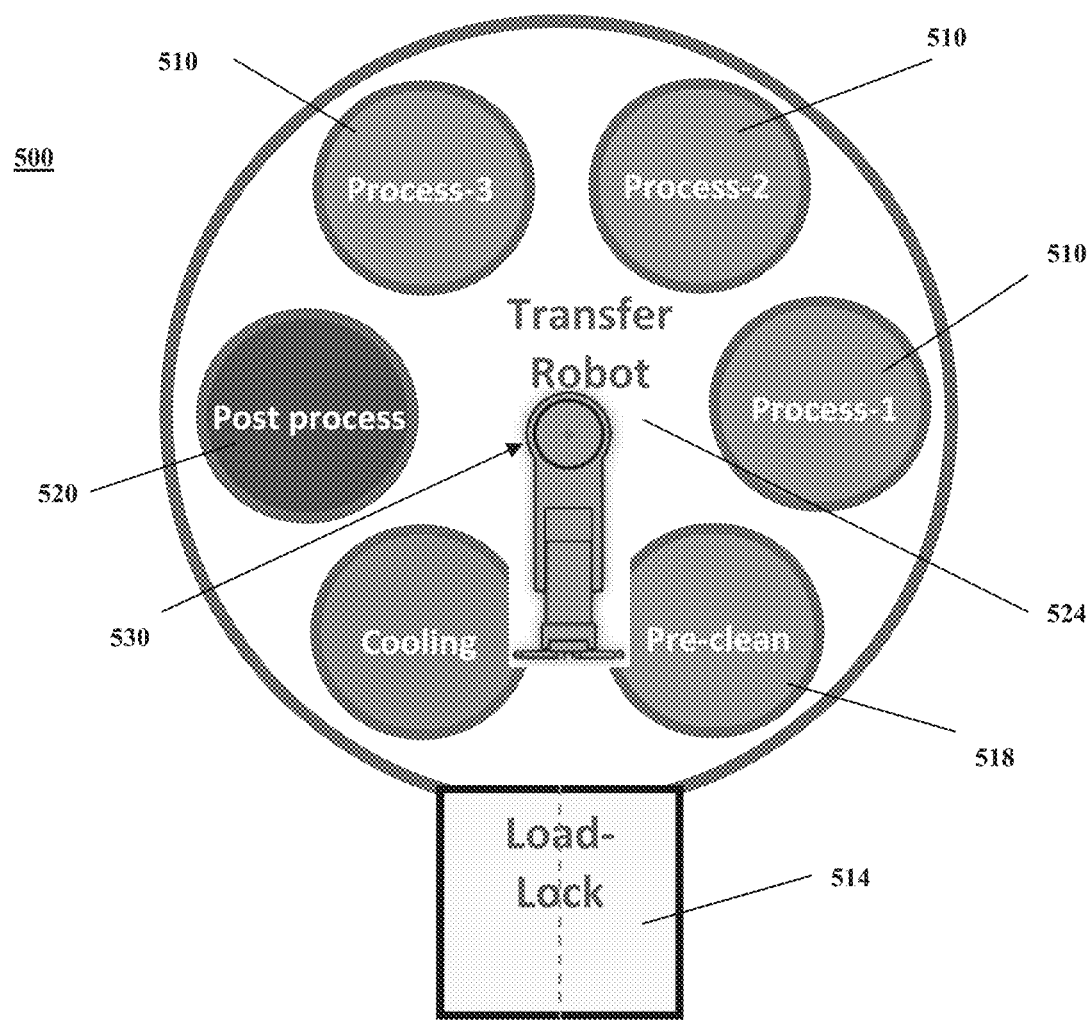
FIG. 9a is a top view of the multiple ICM-chamber cluster system platform.
Figure 9B:
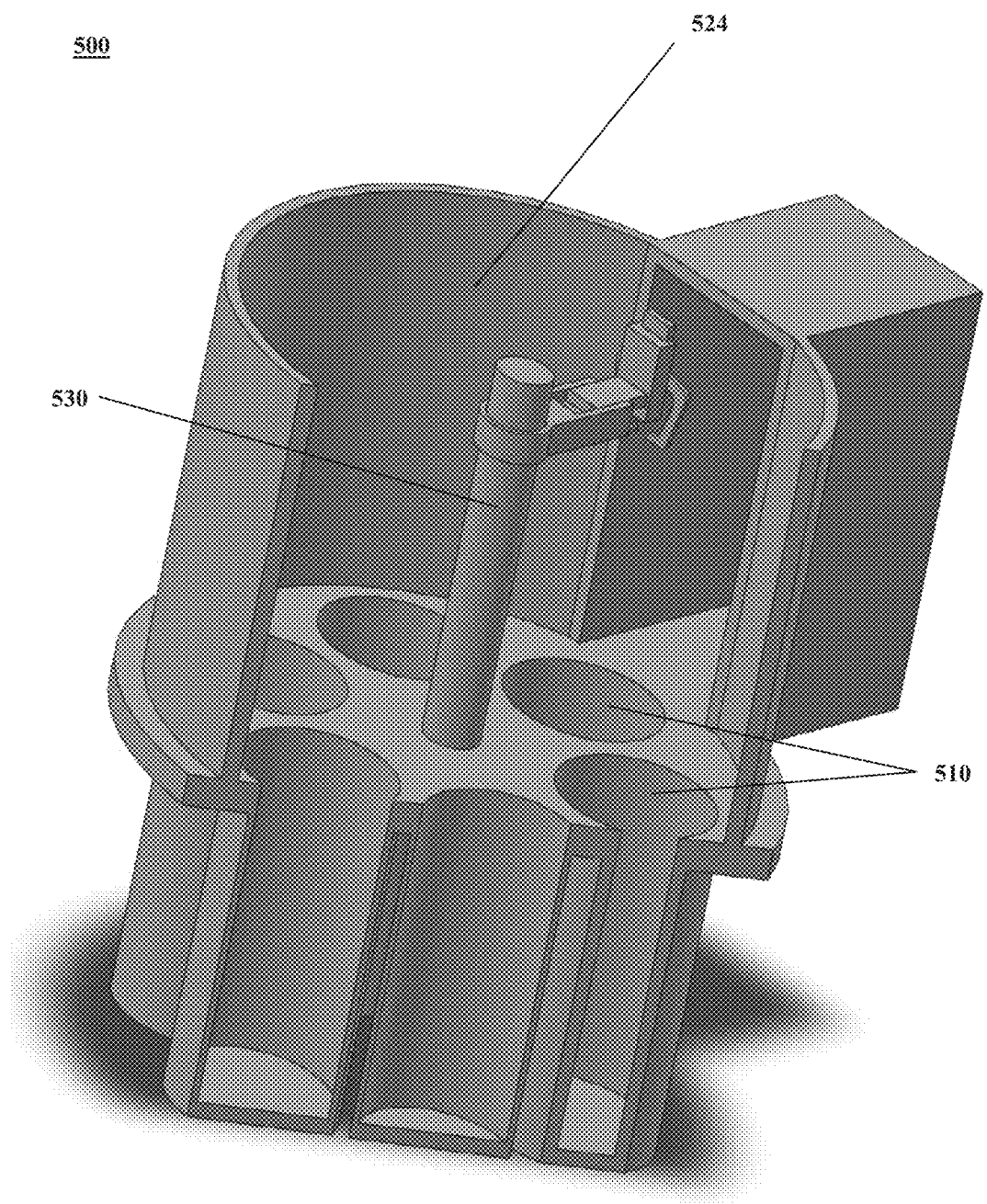
FIG. 9b is perspective view of the multiple ICM-chamber cluster system platform.

As shown in FIGS. 9a-9b, in alternative embodiments, a multiple ICM-chamber system 500 may include a cluster type platform with a transfer robot 530 for carousal holder transportation along with a plurality of chambers 510. The plurality of deposition chambers may include the same target material for higher throughput operation or different process conditions for different film composition and/or properties. Deposition chambers may include different target materials to make multi-layer film stacks. Other non-sputter based chambers may also include a Plasma-Etch chamber for fully integrated device fabrication. A Loadlock Chamber 514 with dual-loadlock may be needed for high throughput operation (one for loading, one for unloading). A Pre-Clean Chamber 518 (for substrate surface clean before deposition) may include (1): heating only using quartz infrared heat lamp for minor substrate surface cleaning, acceleration of pumping down process and substrate warm-up; or (2): sputter clean for thorough substrate surface cleaning and substrate warm-up.

A post-process Chamber 520 may include a heat-treatment chamber. A transfer Chamber 524 hosts the transfer Robot 530 and isolates high vacuum process chambers from Loadlock Chamber 514, as shown in FIG. 9b. Conventional cluster type multi-chamber systems in semiconductor, flat panel display, solar panel and related industries only handle planar substrates such as wafers or glass plates.

While the invention has been described in connection with various embodiments, it will be understood that the invention is capable of further modifications. This application is intended to cover any variations, uses or adaptations of the invention following, in general, the principles of the invention, and including such departures from the present disclosure as, within the known and customary practice within the art to which the invention pertains.

What is claimed is:

1. An inverted cylindrical magnetron (ICM) source comprising:
   a. a co-axial central anode concentrically located within a first annular end anode and a second annular end anode;
   b. a process chamber having a top end and a bottom end in which the first annular end anode and the second annular end anode are coaxially disposed and the process chamber further has a central annular space coupled to a tube insulator disposed about the central annular space wall;
   c. a cathode concentrically coupled to the tube insulator and a target;
   d. a plurality of tunable magnets configured to generate a tunable magnetic field, the plurality of tunable magnets surrounding an exterior of the process chamber, wherein the plurality of tunable magnets comprise a plurality of windings to form a plurality of coils to provide at least two magnetic zones, wherein the plurality of coils comprises a first full-length main coil, and a first mirrored end coil and a second mirrored end coil;
   e. a temperature adjustable target cooling jacket coaxially disposed between the tube insulator and the target; and wherein the plurality of tunable magnets are selected from the group consisting of electromagnets or hybrid electro-permanent magnets, and
   f. a carousel holder coaxially disposed within the process chamber, wherein the carousel holder comprises a plurality of holders configured to hold a plurality of substrates.

2. The ICM source of claim 1, further comprising:
   a plurality of working gas flow inlets and a plurality of pumping ports with adjustable flowing and pumping rates operably coupled to the process chamber to provide a top flow, a top pumping, a bottom pumping, and a bottom flow.

3. The ICM source of claim 2, wherein the top flow pressure and the bottom flow pressure can be independently adjusted.

4. The ICM source of claim 3, further comprising an adjustable gap between cathode and the co-axial central anode.

5. The ICM source of claim 4, wherein the co-axial central anode includes a plurality of working gas inlets to provide a gas supply into the process chamber.

6. The ICM source of claim 1, wherein the substrate is biased on a continuous DC bias between about 0-200 V, or the substrate may be biased with a pulsed DC bias between about 0-500 V, a 0-100% duty cycle, and a frequency between about 1 Hz to 300 kHz.

7. The ICM source of claim 6, further comprising: a first electrically insulated end cap and a second electrically insulated endcap coaxially surrounding the first end anode and the second end anode, respectively, at each end of the process chamber, whereby the first and second electrically insulated end caps coaxially fit within the first and second ends of the process chamber.

8. The ICM source of claim 7, further comprising a ring disposed between the target cooling jacket and the first and second electrically insulated end caps, wherein a recessed feature is included at a top portion of the inner diameter of the first and second electrically insulated end caps.

9. The ICM source of claim 8, wherein the target cooling jacket includes a plurality of embedded cooling channels and small axially oriented grooves on the inner diameter surface of the target cooling jacket.

10. The ICM source of claim 9, wherein the plurality of tunable magnets provide an axial component of magnetic flux density to confine electrons for ionization near the target surface with a range between about 50-500 Gauss.

11. The ICM source of claim 1, further comprising a multi-chamber system for simultaneously processing multiple substrate carousel holders for high-throughput integrated multi-step processing, comprising:
  a. a plurality of ICM chambers operably coupled with a plurality of cylindrical chambers;
  b. a dual loadlock to load incoming substrate carousel holder and unload processed substrate carousel holder out of the plurality of ICM chambers during a deposition procedure; and
  c. a transfer chamber to transfer substrate carousal holders to the plurality of ICM chambers by a transportation robot.

12. An inverted cylindrical magnetron (ICM) source comprising:
  a. a co-axial central anode concentrically located within a first annular end anode and a second annular end anode;
  b. a process chamber having a top end and a bottom end in which the first annular end anode and the second annular end anode are coaxially disposed and the process chamber further has a central annular space coupled to a tube insulator disposed about the central annular space wall;
  c. a first electrically insulated end cap and a second electrically insulated endcap coaxially surrounding the first end anode and the second end anode, respectively, at each end of the process chamber, whereby the first and second electrically insulated end caps coaxially fit within the first and second ends of the process chamber, the first and second electrically insulated end caps further including a recessed feature at a top portion of the inner diameters thereof;
  d. a cathode concentrically coupled to the tube insulator and a target and an adjustable gap between the cathode and the co-axial central anode;
  e. a plurality of tunable magnets comprising a plurality of windings to form a plurality of coils to configured to generate at last two tunable magnetic field zones, the plurality of tunable magnets surrounding an exterior of the process chamber and provide an axial component of magnetic flux density to confine ionization electrons near the target surface with a range between about 50-500 Gauss, wherein the plurality of tunable magnets are selected from the group consisting of electromagnets or hybrid electro-permanent magnets, wherein the plurality of coils comprises a first full length main coil, a first mirrored end coil, and a second mirrored end coil;
  f. a temperature adjustable target cooling jacket coaxially disposed between the tube insulator and the target, the target cooling jacket further including a plurality of embedded cooling channels and axially oriented groves on an inner diameter surface of the target cooling jacket;
  g. a ring disposed between the target cooling jacket and the first and second electrically insulated end caps, wherein a recessed feature is included at a top portion for the inner diameter of the first and second
  h. a plurality of working gas flow inlets and a plurality of pumping ports with adjustable flowing and pumping rates operably coupled to the process chamber to a gas supply to the process chamber and provide a top flow, a top pumping, a bottom pumping, and a bottom flow, wherein a top flow pressure and a bottom flow pressure are capable of being independently adjusted; and
  i. a carousel holder coaxially disposed within the process chamber, wherein the carousel holder includes a plurality of holders to hold a plurality of substrates, wherein the substrates are biased on a continuous DC bias between about 0-200 V, or the substrate may be biased with a pulsed DC bias between about 0-500 V, a 0-100% duty cycle, and a frequency between about 1 Hz to 300 kHz.

13. The ICM source of claim 12, further comprising a multi-chamber system capable of simultaneously processing multiple substrate carousel holders, comprising:
  a. a plurality of ICM chambers operably coupled with a plurality of cylindrical chambers;
  b. a dual loadlock to load incoming substrate carousel holder and unload processed substrate carousel holder out of the plurality of ICM chambers during a deposition procedure; and
  c. a transfer chamber to transfer substrate carousal holders to the plurality of ICM chambers by a transportation robot.

* * * * *